United States Patent
Fukuda et al.

(10) Patent No.: US 6,849,306 B2
(45) Date of Patent: Feb. 1, 2005

(54) PLASMA TREATMENT METHOD AT ATMOSPHERIC PRESSURE

(75) Inventors: Kazuhiro Fukuda, Hino (JP); Yoshikazu Kondo, Hino (JP); Yoshiro Toda, Hino (JP); Kiyoshi Oishi, Hino (JP); Akira Nishiwaki, Hachioji (JP); Wataru Mizuno, Hachioji (JP); Koji Fukazawa, Tachikawa (JP)

(73) Assignee: Konica Corporation, Tokyo (JP)

( * ) Notice: Subject to any disclaimer, the term of this patent is extended or adjusted under 35 U.S.C. 154(b) by 238 days.

(21) Appl. No.: 10/222,318

(22) Filed: Aug. 16, 2002

(65) Prior Publication Data
US 2003/0113479 A1 Jun. 19, 2003

(30) Foreign Application Priority Data

Aug. 23, 2001 (JP) ........................ 2001-253082
Sep. 20, 2001 (JP) ........................ 2001-286720

(51) Int. Cl.[7] .............................................. H05H 1/24
(52) U.S. Cl. .......................................... 427/569; 427/562
(58) Field of Search ................................ 427/569, 562, 427/570, 561

(56) References Cited

U.S. PATENT DOCUMENTS

RE37,294 E * 7/2001 Knapp et al. ................ 427/534
6,558,889 B1 * 5/2003 Oishi et al. .................. 430/532
6,559,070 B1 * 5/2003 Mandal ....................... 438/781
6,652,069 B2 * 11/2003 Toda et al. ................... 347/45

* cited by examiner

Primary Examiner—Bret Chen
(74) Attorney, Agent, or Firm—Frishauf, Holtz, Goodman & Chick, P.C.

(57) ABSTRACT

A plasma treatment method for surface treatment of a substrate with an atmospheric pressure plasma treatment apparatus is disclosed. The apparatus has a first electrode and a second electrode opposed to each other, a discharge space between the opposed electrodes, a voltage application means for applying voltage across the discharge space, a gas supply means for supplying a reactive gas and an inert gas to the discharge space. The method is one wherein the reactive gas at the discharge space is excited at atmospheric pressure or at approximately atmospheric pressure by applying voltage through the voltage application means to generate discharge plasma, and a substrate is exposed to the discharge plasma to be subjected to surface treatment, and wherein the reactive gas is not directly in contact with the discharge surface of the first electrode or the second electrode.

23 Claims, 9 Drawing Sheets

PLASMA TREATMENT METHOD AT ATMOSPHERIC PRESSURE

FIELD OF THE INVENTION

The present invention relates to an atmospheric pressure plasma treatment apparatus and an atmospheric pressure plasma treatment method.

BACKGROUND OF THE INVENTION

Various materials, in which layers with high function, for example, an electrode layer, a dielectric protective layer, a semi-conductor layer, a transparent electro-conductive layer, an anti-reflection layer, an optical interference layer, a hard coat layer, a subbing layer, and a barrier layer etc. are provided on a substrate, are used in a semi-conductor device or various kinds of devices for a displaying, recording or converting light to electricity.

These layers with high function are formed according to a dry coating method employing vacuum processing such as a spattering method, a vacuum depositing method or an ion plating method.

The vacuum processing requires a vacuum processing apparatus, resulting in high cost of the equipment. Further, the vacuum processing is difficult in continuous production, and low in a layer forming speed, resulting in disadvantage of lowering of productivity.

As a method for overcoming the disadvantage in that use of the vacuum processing apparatus results in lowering of productivity, an atmospheric plasma treatment process is proposed in Japanese Patent O.P.I. Publication No. 61-238961 in which generates a discharge plasma at atmospheric pressure to obtain a high processing effect by the discharge plasma. The atmospheric plasma treatment process can form a layer with a uniform composition, physical property or distribution on the surface of a substrate. Further, the atmospheric plasma treatment process can carry out the processing under at atmospheric pressure or approximately atmospheric pressure, and does not require a vacuum processing apparatus, it makes it possible to reduce the equipment cost, carry out continuous production, and increase a layer forming speed. A method is disclosed in Japanese Patent O.P.I. Publication Nos. 11-133205, 2000-185362, 11-61406, 2000-147209, and 2000-121804, which comprises subjecting a reactive gas to discharge treatment at atmospheric pressure or approximately atmospheric pressure, exciting the reactive gas to a plasma state and forming a layer on a substrate (hereinafter referred to also as an atmospheric pressure plasma method). The atmospheric pressure plasma method disclosed in these publications generates discharge plasma between two opposed electrodes by applying pulsed electric field with a frequency of from 0.5 to 100 kHz and with a strength of electric field of from 1 to 100 V/cm. Further, a method is disclosed in Japanese Patent O.P.I. Publication No. 6-330326 in which a metal alkoxide is added during atmospheric plasma discharge to form a metal oxide layer.

However, the metal alkoxide above, for example, an organic silicate compound, an organic titanium compound, an organic tin compound, an organic zinc compound, an organic indium compound, an organic aluminum compound, an organic copper compound, or an organic silver compound, is liquid under ordinary temperature whose vapor pressure is not so high. The alkoxide requires to be gasified by heating, mixed with inert gas such as argon or helium, and introduced to a discharge space between opposed electrodes. When the surface temperature of the electrode is lower than temperature of the mixed gas, the component such as the above metal oxide condenses on the electrode which causes the problems in that a mixed gas with a constant composition cannot be obtained, a uniform layer is difficult to obtain, and the condensed portions are reacted to form a solid, resulting in clogging of the gas path and contamination on the electrode surface.

The present inventors have succeeded to form a uniform layer with higher quality on a substrate rapidly by subjecting the substrate to plasma treatment applying a high frequency voltage exceeding 100 kHz at not less than 1 W/cm$^2$. However, there occurs phenomenon in that continuous plasma discharge treatment employing such a high power shortens time when contamination begins to occur on the electrodes, and the contamination is more apparent, and further use of the electrodes with contamination deteriorates layer formation on the substrate, lowers quality of the formed layer, produces layer thickness variation, and lowers strength of the formed layer. Further, frequency of cleaning contamination increases, resulting in lowering productivity. When such phenomenon occurs during the manufacture, the manufacture is suspended to clean electrodes etc., conditioning and warm-up is carried out to restart the manufacture, which is time consuming and lowers production efficiency.

Heating the electrodes in order to prevent gas from condensing on the electrode is likely to induce non-uniform discharge due to dielectric breakage of the electrode which cannot form a uniform layer on the substrate.

SUMMARY OF THE INVENTION

The present invention has been made in view of the above. An object of the invention is to provide an atmospheric pressure plasma treatment apparatus and an atmospheric plasma treatment process which maintain durability of the electrode over a long term, realize stable discharge, minimize occurrence of condensates or contaminants on the electrode surface, and can stably form a layer with high quality over a long time.

DETAILED DESCRIPTION OF THE INVENTION

Figure 1:
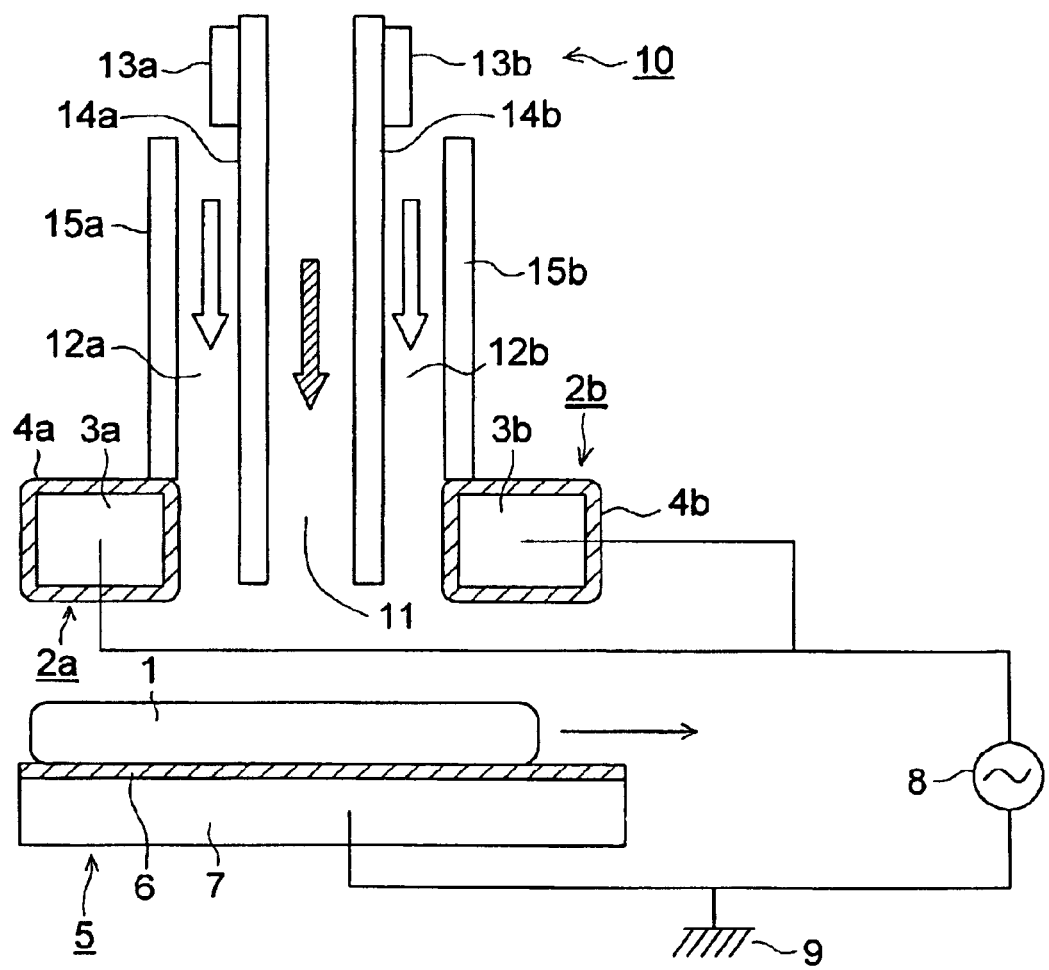
FIG. 1 is a sectional view of one embodiment of the gas supply section and the electrode section in the atmospheric pressure plasma treatment apparatus of the invention.

The above object of the invention can be attained by each of the following constitutions:

1. An atmospheric pressure plasma treatment apparatus comprising a first electrode and a second electrode opposed to each other in which a discharge space is formed between the opposed electrodes, a voltage application means for applying voltage across the discharge space, a gas supply means for supplying a reactive gas and an inert gas to the discharge space, wherein the reactive gas at the discharge space is excited at atmospheric pressure or at approximately atmospheric pressure by applying voltage through the voltage application means to generate discharge plasma, and a substrate is exposed to the discharge plasma to be subjected to surface treatment, and wherein the apparatus is constructed so that the reactive gas is not directly in contact with the discharge surface of the first electrode or the second electrode.

2. The atmospheric pressure plasma treatment apparatus of item 1, wherein the gas supply means comprises a reactive gas supply means for supplying the reactive gas to the discharge space and an inert gas supply means for supplying the inert gas to the discharge space, and is constructed so that the reactive gas and the inert gas are supplied to the discharge space, separately.

3. The atmospheric pressure plasma treatment apparatus of item 2, wherein the atmospheric pressure plasma treatment apparatus is constructed so that the substrate is provided so as to cover a discharge surface of the second electrode, the reactive gas is supplied to the side of the second electrode and the inert gas is supplied to the side of the first electrode.

4. The atmospheric pressure plasma treatment apparatus of item 2, wherein the atmospheric pressure plasma treatment apparatus is constructed so that the substrate is provided so as to cover the surface of the second electrode, the first electrode is comprised of plural electrodes arranged at an interval, and the gas supply means is constructed so that the inert gas and the reactive gas are supplied from at least one of the intervals between the two adjacent electrodes of the plural electrodes to the surface of the substrate provided on the second electrode.

5. The atmospheric pressure plasma treatment apparatus of any one of items 1 through 4, wherein the reactive gas supply means comprises a temperature controlling means.

6. The atmospheric pressure plasma treatment apparatus of item 5, wherein the temperature controlling means is a means for heating the reactive gas.

7. The atmospheric pressure plasma treatment apparatus of item 6, wherein the temperature controlling means controls to temperature higher than temperature at which the reactive gas gives a saturated vapor pressure at its concentration.

8. The atmospheric pressure plasma treatment apparatus of any one of items 1 through 7, wherein the first electrode or the second electrode is a dielectric coated electrode in which a metal base material is coated with a dielectric layer.

9. The atmospheric pressure plasma treatment apparatus of item 8, wherein the dielectric layer is a layer formed by thermally spraying ceramic on a base material to form a ceramic layer, and then sealing the ceramic layer.

10. The atmospheric pressure plasma treatment apparatus of any one of items 1 through 9, wherein the apparatus comprises a cooling means for cooling the first electrode or the second electrode.

11. The atmospheric pressure plasma treatment apparatus of any one of items 1 through 9, wherein the first electrode and the second electrode both have planar surfaces, and the surfaces of the first electrode and the second electrode are provided so as to insert the same plane and so as to be in parallel with each other.

12. The atmospheric pressure plasma treatment apparatus of any one of items 1 through 10, wherein at least one of the first and second electrodes is a rotatory roll electrode.

13. The atmospheric pressure plasma treatment apparatus of item 12, wherein the second electrode is a rotatory roll electrode, and the first electrode is comprised of plural electrodes, the surface of the plural electrodes being substantially in parallel with the surface of the second electrode.

14. The atmospheric pressure plasma treatment apparatus of item 12, wherein the second electrode is a rotatory roll electrode, and the first electrode has a concave surface which is substantially in parallel with the curved surface of the second electrode.

15. The atmospheric pressure plasma treatment apparatus of any one of items 1 through 14, wherein the first electrode is a voltage application electrode and the second electrode is a ground electrode.

16. The atmospheric pressure plasma treatment apparatus of any one of items 1 through 15, wherein a layer is formed on the substrate by the surface treatment.

17. An atmospheric pressure plasma treatment method comprising the steps of:

supplying a reactive gas and an inert gas to a discharge space formed between a first electrode and a second electrode opposed to each other;

applying voltage across the discharge space;

exciting the reactive gas at atmospheric pressure or at approximately atmospheric pressure to generate discharge plasma; and subjecting a substrate to surface treatment by exposing the substrate to the discharge plasma;

wherein the reactive gas is not directly in contact with the discharge surface of the first electrode or the second electrode.

18. The atmospheric pressure plasma treatment method of item 17, wherein the reactive gas and the inert gas are supplied to the discharge space, separately.

19. The atmospheric pressure plasma treatment method of item 18, wherein the substrate is provided so as to cover a discharge surface of the second electrode, the reactive gas is supplied to the side of the second electrode and the inert gas is supplied to the side of the first electrode.

20. The atmospheric pressure plasma treatment method of item 18, wherein the substrate is provided so as to cover the surface of the second electrode, the first electrode is comprised of plural electrodes arranged at an interval, and the inert gas and the reactive gas are supplied from at least one of the intervals between the two adjacent electrodes of the plural electrodes to the surface of the substrate provided on the second electrode.

21. The atmospheric pressure plasma treatment method of any one of items 17 through 20, wherein the temperature of the reactive gas is controlled.

22. The atmospheric pressure plasma treatment method of item 21, wherein the reactive gas is controlled to be a temperature higher than temperature at which the reactive gas gives a saturated vapor pressure at its concentration.

23. The atmospheric pressure plasma treatment method of any one of items 17 through 22, wherein the first electrode or the second electrode is a dielectric coated electrode in which a metal base material is coated with a dielectric layer.

24. The atmospheric pressure plasma treatment method of item 23, wherein the dielectric layer is a layer formed by thermally spraying ceramic on a base material to form a ceramic layer, and then sealing the ceramic layer.

25. The atmospheric pressure plasma treatment method of any one of items 17 through 24, wherein the first electrode or the second electrode is cooled.

26. The atmospheric pressure plasma treatment method of any one of items 17 through 25, wherein the first electrode and the second electrode both have planar surfaces, and the surfaces of the first electrode and the second electrode are provided so as to insert the same plane and so as to be in parallel with each other.

27. The atmospheric pressure plasma treatment method of any one of items 17 through 25, wherein at least one of the first and second electrodes is a rotatory roll electrode.

28. The atmospheric pressure plasma treatment method of item 27, wherein the second electrode is a rotatory roll electrode, and the first electrode is comprised of plural electrodes, the surface of the plural electrodes being substantially in parallel with the surface of the second electrode.

29. The atmospheric pressure plasma treatment method of item 27, wherein the second electrode is a rotatory roll electrode, and the first electrode has a concave surface which is substantially in parallel with the curved surface of the second electrode.

30. The atmospheric pressure plasma treatment method of any one of items 17 through 29, wherein the voltage is a high frequency voltage with a frequency exceeding 100 kHz.

31. The atmospheric pressure plasma treatment method of item 30, wherein the output of the high frequency voltage is not less than 1 W/cm$^2$.

32. The atmospheric pressure plasma treatment method of any one of items 17 through 31, wherein the reactive gas comprises a component selected from an organometallic compound and an organic compound.

33. The atmospheric pressure plasma treatment method of item 32, wherein the organometallic compound is selected from the group consisting of a metal alkoxide, an alkylated metal and a metal complex.

34. The atmospheric pressure plasma treatment method of item 33, wherein the reactive gas comprises a component selected from helium, neon, argon, krypton, xenon, radon and nitrogen.

35. The atmospheric pressure plasma treatment method of item 33, wherein the reactive gas comprises a component selected from oxygen, ozone, hydrogen peroxide, carbon dioxide, carbon monoxide, hydrogen, nitrogen, water vapor, nitrogen oxides and ammonia.

36. The atmospheric pressure plasma treatment method of any one of items 17 through 35, wherein the inert gas comprises a component selected from helium, neon, argon, krypton, xenon, radon, and nitrogen.

37. The atmospheric pressure plasma treatment method of item 36, wherein the inert gas comprises a component selected from oxygen, ozone, hydrogen peroxide, carbon dioxide, carbon monoxide, hydrogen, nitrogen, water vapor, nitrogen oxides and ammonia.

38. The atmospheric pressure plasma treatment method of any one of items 17 through 37, wherein the first electrode is a voltage application electrode and the second electrode is a ground electrode.

39. The atmospheric pressure plasma treatment method of any one of items 17 through 38, wherein a layer is formed by the surface treatment.

An embodiment of the atmospheric pressure plasma treatment apparatus and the atmospheric plasma treatment method of the invention will be explained below employing figures, but the invention is not limited thereto. In the following explanation, a decisive expression may be included in the terminology, but it shows the preferred examples but does not limit the meaning of the terminology or the scope of the invention.

The atmospheric pressure plasma treatment apparatus of the invention can form various kinds of layers with high function on a substrate, and can be used to form, for example, an electrode layer, a dielectric protective layer, a semi-conductor layer, a transparent electro-conductive layer, an electrochromic layer, a fluorescent layer, a superconduction layer, a dielectric layer, a solar battery layer, an anti-reflection layer, an anti-abrasion layer, an optical interference layer, a reflection layer, an anti-static layer, an electroconductive layer, an anti-stain layer, a hard coat layer, a subbing layer, a barrier layer, an electromagnetic radiation shielding layer, an infrared ray shielding layer, a UV absorption layer, a lubricant layer, a shape-memory layer, a magnetic recording layer, a light emission element layer, a layer applied to organisms, an anti-corrosion layer, a catalyst layer, a gas-sensor layer, and a layer for decoration.

FIG. 1 is a sectional view of one embodiment of the gas supply section and the electrode section in the atmospheric pressure plasma treatment apparatus of the invention.

In FIG. 1, the numerical number 1 is a substrate on which a layer is formed.

The substrate used in the invention may be in the form of film or in the form of stereoscopic body, for example, in the form of lens, as long as it can form a layer on its surface. Materials for the substrate are not specifically limited, and glass or resins can be used.

Materials constituting the substrate are not specifically limited, but resins are preferred in that discharge is a low temperature plasma discharge, and is carried out at atmospheric pressure or at approximately atmospheric pressure.

For example, when the layer regarding the invention is an anti-reflection layer, the substrate is preferably a film of cellulose ester such as cellulose triacetate, polyester, polycarbonate or polystyrene, or one in which a gelatin layer, a polyvinyl alcohol (PVA) layer, an acryl resin layer, a polyester resin layer or a cellulose resin layer is coated on the above described film. As the substrate, a substrate having an anti-glare layer which is a resin layer formed by polymerizing a composition containing an ethylenically unsaturated monomer, a substrate having a clear hard coat layer, or a substrate in which a backing layer or an anti-static layer is coated on a support can be used.

Examples of the support (also used as the substrate) include a polyester film such as a polyethylene terephthalate or polyethylene naphthalate film, a polyethylene film, a polypropylene film, a cellophane film, a film of a cellulose ester such as cellulose diacetate, cellulose acetate butyrate, cellulose acetate propionate, cellulose acetate phthalate, cellulose triacetate, cellulose nitrate or their derivative, a polyvinylidene chloride film, a polyvinyl alcohol film, an ethylene-vinyl alcohol film, a syndiotactic polystyrene film, a polycarbonate film, a norbornene resin film, a polymethylpentene film, a polyetherketone film, a polyimide film, a polyethersulfone film, a polysulfone film, a polyetherketoneimide film, a polyamide film, a fluorine-containing resin film, a nylon film, a polymethyl methacrylate film, an acryl film, and a polyarylate film.

These materials can be used singly or as a mixture of two or more kinds thereof. Commercially available materials such as Zeonecks (produced by Nippon Zeon Co., Ltd.) or ARTON (produced by Nippon Gosei Gomu Co., Ltd.) can be preferably used. Materials such as polycarbonate, polyacrylate, polysulfone and polyethersulfone, which have a high specific birefringence, can be also used by properly adjusting a solution casting condition, a melt extrusion condition, or a stretching condition in the transverse or mechanical direction. The substrate in the invention is not specifically limited to those described above. As the substrate in the invention, a film having a thickness of 10 to 1000 $\mu$m is preferably used.

When in the invention the layer formed on the substrate is an anti-reflection layer, a cellulose ester film is preferably used as the support in the invention, since it provides a low reflection laminate. As the cellulose ester, cellulose acetate, cellulose acetate butyrate, or cellulose acetate propionate is preferably used and cellulose acetate butyrate, or cellulose acetate propionate is more preferably used in effectively obtaining the effects of the invention.

In FIG. 1, numerical numbers 2a and 2b are each voltage application electrodes (first electrodes), and voltage application electrodes 2a and 2b are a dielectric coated electrode in which the surface of a metal base material 3a is coated with a dielectric layer 4a and a dielectric coated electrode in which the surface of a metal base material 3b is coated with a dielectric layer 4b, respectively. They have a cooling means (not illustrated) in the interior, and control temperature of the surface of the electrodes by supplying chilled water etc. to the interior during discharge.

On the other hand, a ground electrode 5 (second electrode) supporting a substrate is provided being opposed to the voltage application electrodes 2a and 2b. Substrate 1 is transported in the arrow direction while substrate 1 contacts the surface of the ground electrode 5 on the side of the voltage application 2a and 2b. The ground electrode 5 is also a dielectric coated electrode in which the surface of a metal base material 7 is coated with a dielectric layer 6. The ground electrode 5 also controls temperature of the surface by supplying chilled water etc. to the interior (not illustrated).

In the above, the voltage application electrode is explained as a first electrode and the ground electrode as a second electrode, but the voltage application electrode may be regarded as a second electrode, and the ground electrode as a first electrode. When a substrate is provided in a discharge space to form a layer, it is preferred in view of design or safety that the apparatus is constructed so that the ground electrode is covered with the substrate and the exposed discharge surface of the voltage application electrode does not directly contact the reactive gas.

Examples of the metal base material (3a, 3b, or 7) used in the electrodes described above include metals such as silver, platinum, stainless steel, aluminum, or iron. Stainless steel or titanium is preferable in view of processability.

The dielectric of the dielectric layer (4a, 4b or 6) is preferably an inorganic compound with a specific dielectric constant of 6 to 45. Examples thereof include ceramic such as alumina or silicon nitride, and a glass lining material such as silicate glass or borate glass. Of these, a dielectric layer is preferred which is coated on the electrode preferably by thermal spraying of alumina.

The present inventors have found a dielectric coated electrode coated with a dielectric layer having a void volume of not more than 10% by volume, preferably not more than 8% by volume as one embodiment of the electrodes capable of resisting a high electric power. A dielectric layer having a void volume of from more than 0 to 5% by volume is still more preferred. Herein, the void volume of the dielectric layer refers to a volume of voids having openings at the dielectric layer surface in the layer thickness direction, and can be measured employing a mercury porosimeter. In the examples described later, the void volume of a dielectric layer coated on a conductive base material was measured employing a Mercury Porosimeter produced by Shimazu Seisakusho Co., Ltd. The dielectric layer having a low void volume provided high durability. A dielectric layer having voids whose volume is low is, for example, a thermally sprayed ceramic layer with high density and high adhesion prepared according to an atmospheric plasma method as described later. In order to further reduce the void volume, a sealing treatment is preferably carried out.

Another preferred embodiment of the electrodes is a dielectric coated electrode in which a dielectric layer is coated on an electrode by means of a glass lining method employing a glass produced according to a melting method. In this embodiment, a dielectric layer comprised of two or more layers, which differ in foam content, provides higher durability. It is preferred in the embodiment that the foam content of the lowest layer which contacts the conductive base material is 20 to 30% by volume, and the foam content of the layer or layers provided on the lowest layer is not more than 5% by volume. The foam content can be calculated from the density of glass itself and the density of the glass lining layer. The melted glass ordinarily foams but can be defoamed. Accordingly, the foam content can be adjusted to an intended value varying a defoaming degree. The dielectric formed in a layer according to a glass lining method, the foam content of which is controlled, provides an electrode with high durability. In the above embodiment it is preferred that the total thickness of the dielectric layers is 0.5 to 2.0 mm, or the thickness of the lowest layer is not less than 0.1 mm, and the total thickness of the layer or layers provided on the lowest layer is not less than 0.3 mm.

Still another preferred embodiment of the dielectric coated electrodes of the invention capable of resisting high electric power is one having a heat resistant temperature of not less than 100° C., preferably not less than 120° C., and more preferably not less than 150° C. The heat resistant temperature herein refers to a highest temperature capable of carrying out normal discharge without causing dielectric breakdown. The above heat resistant temperature can be attained by employing a dielectric layer formed according to the thermal spray of ceramic as described above, by employing a dielectric layer comprised of two or more layers, which differ in foam content, formed according to the glass-lining as described above, or by properly selecting conductive base materials and dielectrics in which the difference in linear thermal expansion coefficient between the conductive base materials and dielectrics falls within the range as described below.

Still further another preferred embodiment of the dielectric coated electrodes of the invention is a combination of conductive base material and dielectrics in which the difference in linear thermal expansion coefficient between the conductive base material and dielectrics is not more than $10 \times 10^{-6}/°$ C. The difference in linear thermal expansion coefficient between the conductive base materials and dielectrics is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

Combinations of conductive base materials and dielectric having a difference in linear thermal expansion coefficient between them falling within the range as described above will be listed below.

(1) A combination of pure titanium as conductive base material and a thermal spray ceramic layer as a dielectric layer
(2) A combination of pure titanium as conductive base material and a glass lining layer as a dielectric layer
(3) A combination of titanium alloy as conductive base material and a thermal spray ceramic layer as a dielectric layer
(4) A combination of stainless steel as conductive base material and a glass lining layer as a dielectric layer
(5) A combination of titanium alloy as conductive base material and a thermal spray ceramic layer as a dielectric layer
(6) A combination of stainless steel as conductive base material and a glass lining layer as a dielectric layer
(7) A combination of a composite of ceramic and iron as conductive base material and a thermal spray ceramic layer as a dielectric layer
(8) A combination of a composite of ceramic and iron as conductive base material and a glass lining layer as a dielectric layer
(9) A combination of a composite of ceramic and aluminum as conductive base material and a thermal spray ceramic layer as a dielectric layer
(10) A combination of a composite of ceramic and aluminum as conductive base material and a glass lining layer as a dielectric layer In view of the difference in the linear thermal expansion coefficient, the combinations of (1) through (4), and (7) through (10) above are preferred.

Still another preferred embodiment of the dielectric coated electrodes of the invention capable of resisting high power is a dielectric coated electrode in which the dielectric layer has a thickness of from 0.5 to 2 mm. The variation of the dielectric layer thickness is preferably not more than 5%, more preferably not more than 3%, and still more preferably not more than 1%.

As a method of thermally spraying ceramic as a dielectric onto the above conductive base material with high density and high adhesion, there is an atmospheric plasma spraying method. The atmospheric pressure plasma spraying method refers to a technique in which fine particles or wires of ceramic etc. are introduced into a source of plasma heat to form a melted or semi-melted particles, and the resulting particles are sprayed to a base material on which a layer is to be formed. The source of plasma heat herein referred to is a high temperature plasma gas obtained by heating gas molecules to high temperature to dissociate into atoms and applying further energy thereto to release electrons. The spraying speed of this plasma gas is high, and therefore the sprayed gas colloids the base material with a spray speed higher than that of a conventional arc spraying or a flame spraying, providing a layer with high adhesion and higher density. A spraying method disclosed in Japanese Patent O.P.I. Publication Nos. 2000-301655 can be referred to in which a heat shielding layer is formed on material heated to high temperature. According to this method, it is possible to form a dielectric layer (thermally sprayed ceramic layer) having a void volume of not more than 10% by volume, and further not more than 8% by volume.

In order to further reduce the void volume of the dielectric layer, it is preferred that a thermally sprayed layer such as the thermally sprayed ceramic layer is subjected to sealing treatment employing an inorganic compound. The inorganic compound is preferably a metal oxide, and more preferably one containing a silicon oxide (SiOx) as a main component.

The inorganic compound for sealing is preferably one being hardened through sol-gel reaction. When an inorganic compound for sealing is a compound containing a metal oxide as a main component, a metal alkoxide is coated on the ceramic spray layer as a sealing solution, and hardened through sol gel reaction. When the inorganic compound for sealing is a compound containing silica as a main component, an alkoxysilane is preferably used as a sealing solution.

In order to accelerate the sol gel reaction, energy treatment is preferably carried out. Examples of the energy treatment include heat hardening (hardening at not more than 200° C.) or UV irradiation. A sealing method, in which the alternate coating and hardening of diluted sealing solution are repeated several times, provides an electrode with improved inorganic property, with high density and without any deterioration.

When in the preparation of the dielectric coated electrode of the invention, a metal oxide solution as a sealing solution is coated on a thermally sprayed ceramic layer and subjected to sealing treatment in which hardening is carried out through sol gel reaction, the metal oxide content after hardening is preferably not less than 60 mol %. When an alkoxysilane is used as a metal alkoxide of a sealing solution, the content of SiOx (x: not more than 2) after hardening is preferably not less than 60 mol %. The content of SiOx (x: not more than 2) after hardening is measured analyzing the section of the dielectric layer through an XPS.

The dielectric layer surface of the dielectric coated electrode is surface finished by polishing treatment so as to obtain a surface roughness Rmax (according to JIS B 0601) of not more than 10 μm, which makes it possible to maintain the dielectric layer thickness or a discharge space between the electrodes constant, provide stable discharge, and provide an electrode with greatly increased durability, with high precision and without strain or cracking due to thermal shrinkage difference or residual stress. It is preferred that at least the surface of the dielectric layer on the side contacting the substrate is surface finished by polishing.

In FIG. 1, numerical number 8 is a high frequency power source as a voltage application means for applying a high frequency voltage across the voltage application electrodes 2a and 2b and the grounded electrode 5. The voltage applied has preferably a frequency exceeding 100 kHz in obtaining a layer with high quality. The preferred upper limit of the frequency is not more than 150 MHz. Power sources used in the invention are not specifically limited. As the power sources, a high frequency power source (200 kHz) produced by Pearl Kogyo Co., Ltd., a high frequency power source (800 kHz) produced by Pearl Kogyo Co., Ltd., a high frequency power source (2 MHz) produced by Pearl Kogyo Co., Ltd., a high frequency power source (13.56 MHz) produced by Nippon Denshi Co., Ltd., and a high frequency power source (150 MHz) produced by Pearl Kogyo Co., Ltd. can be used.

Numerical number 9 shows a ground, and the ground electrode 5 is grounded on the earth 9. The discharge output applied across the electrodes (discharge space) is preferably not less than 1 W/cm$^2$ in obtaining a layer with high quality. The discharge output is more preferably from 1 to 50 W/cm$^2$. The above range of the discharge output can increase a plasma density of the discharge plasma.

In FIG. 1, numerical number 10 shows a gas supply section as a gas supply means. The gas supply section 10 has path 11 (a reactive gas supply means) for a reactive gas on the center for forming a layer, and paths 12a and 12b (an inert gas supply means) for an inert gas around the surroundings which does not substantially form a layer. The outlet of the reactive gas path is provided at substantially the same position as the lower surface of the voltage application electrodes 2a and 2b so that the reactive gas does not directly contact the voltage application electrodes 2a and 2b. Walls 14a and 14b of the gas path separate the path 11 for the reactive gas from the paths 12a and 12b for the inert gas, and walls 15a and 15b of the gas path separate the paths 12a and 12b for the inert gas from the exterior.

In FIG. 1, the reactive gas shown in a hatched arrow is inserted between the inert gases shown in a hollow arrow, and supplied to the substrate surface. The reactive gas, which has collided with the substrate surface, flows along the substrate surface and is exhausted, and the inert gas, which has collided with the substrate surface, flows along the discharge surface of the electrode and is exhausted.

The structure of the path 11 for the reactive gas, a reactive gas supply means and the paths 12a and 12b for the inert gas, inert gas supply means is not specifically limited, as long as it is a structure that the reactive gas does not contact the discharge surface of the electrode. The path structure may be one in the form of slits which are separated from each other by linear walls such as walls 14a, 14b, 15a, and 15b, or one in the form of cylinders which are different in diameter from each other. The former is preferred in view of simplicity and ease of temperature control. In the invention, a temperature controlling means, which controls temperature of the walls 14a and 14b of the gas path, is preferably provided in order to heat the reactive gas and prevent condensation of the reactive gas. In FIG. 1, numerical Nos. 13a and 13b are temperature controlling systems as a heating means for heating walls of a tube supplying the reactive gas (corresponding to the walls 14a and 14b of the reactive gas path). The temperature of the reactive gas to be supplied to the discharge space is preferably higher than temperature at which the reactive gas gives a saturated vapor pressure at its concentration. Material for the walls 14a, 14b, 15a and 15b, which are the walls of the reactive gas path 11, and the walls of the inert gas paths 12a and 12b, are not specifically restricted, as long as it has sufficient strength, high corrosion resistance to each gas, and high thermal conductivity, but is preferably ceramic.

Although not illustrate, the temperature controlling systems 13a and 13b are comprised of a temperature sensor section, a heating section and a controlling section. Heating to intended temperature is carried out employing a heated medium incorporated in the walls of the reactive gas path, based on temperature detected by the temperature sensor.

Next, a gas to be supplied to the discharge space will be explained. A gas used in the invention is basically inert gas and a reactive gas for forming a layer, although it varies due to kinds of a layer formed on the substrate. The reactive gas content is preferably 0.01 to 10% by volume, based on the total amount of gas to be supplied to the discharge space. As the layer to be formed, a layer having a thickness of 1 nm to 1000 nm is formed.

Examples of the inert gas herein referred to include inert gas (helium, neon, argon, krypton, xenon, or radon) belonging to group XVIII in the periodic table. In order to obtain the effects of the invention, helium or argon is preferably used. Nitrogen can be also used as the inert gas. The content of the inert gas at the discharge space is preferably 99 to 99.9% by volume of the total amount of the gas supplied to the discharge space. The inert gas can contain hydrogen, and use of hydrogen in the inert gas can greatly increase hardness of a layer formed. The content of hydrogen at the discharge space is preferably 0.1 to 10% by volume of the total amount of the gas supplied to the discharge space.

The inert gas can also contain a component selected from oxygen, ozone, hydrogen peroxide, carbon dioxide, carbon monoxide, nitrogen, and hydrogen, and the use of the component can accelerate reaction and form a layer with high density and high quality. Similarly, use of water ($H_2O$), nitrogen oxides ($No_x$), or ammonia ($NH_3$) can obtain the same effects as above. The content of such a component capable of accelerating reaction at the discharge space is preferably 0.1 to 5% by volume of the total amount of the gas supplied to the discharge space.

The reactive gas can contain at least one organometallic compound selected from zinc acetyl acetonate, triethylindium, trimethylindium, diethylzinc, dimethylzinc, tetraethyltin, and tetraoctyltin, and use of the reactive gas can form a metal oxide layer which is useful for a medium refractive index layer such as a conductive layer, an anti-static layer, or an anti-reflection layer.

Employing a fluorine-containing compound, a water repellent layer with a water repellent surface can be formed on a substrate, the surface of which contains a fluorine-containing group lowering the surface energy. Examples of the fluorine-containing compound include a carbon fluoride compound such as hexafluoropropylene ($CF_3CFCF_2$), or octafluorocyclobutane ($C_4F_8$). In view of safety, hexafluoropropylene or octafluorocyclobutane, which does not generate a harmful gas such as hydrogen fluoride, is preferably used.

The substrate is treated in an atmosphere of a monomer containing a hydrophilic group and a polymerizable unsaturated bond in the molecule, and a hydrophilic polymerization layer can be deposited on the substrate surface. Examples of the hydrophilic group include a hydroxyl group, a sulfonic acid group, a primary, secondary or tertiary amino group, an amido group, a quaternary ammonium group, a carboxylic acid group, and a carboxylic acid salt group. Use of a monomer containing a polyethylene glycol chain can also form a hydrophilic polymerization layer.

Examples of the monomer described above include acrylic acid, methacrylic acid, acryl amide, methacryl amide, N,N-dimethylacryl amide, sodium acrylate, sodium methacrylate, potassium acrylate, potassium methacrylate, styrene sulfonic acid sodium salt, allyl alcohol, allyl amine, polyethylene glycol dimethacrylate, and polyethylene glycol diacrylate, and at least one of these monomers can be used.

Further, use of a reactive gas containing an organic fluorine compound, a silicon compound or a titanium compound can form a low refractive index anti-reflection layer or a high refractive index layer.

As the organic fluorine compound, a fluorocarbon gas or a fluorohydrocarbon gas is preferably used. Examples of the fluorocarbon gas include tetrafluorocarbon, hexafluorocarbon, for example, tetrafluoromethane, tetrafluoroethylene, hexafluoropropylene, and octafluorocyclobutane. Examples of the fluorohydrocarbon gas include difluoromethane, tetrafluoroethane, tetrafluoropropylene, and trifluoropropylene.

Further, fluorohydrocarbon halide compounds such as monochlorotrifluoromethane, monochlorodifluoromethane or dichlorotetrafluorocyclobutane, or fluorinated organic compounds such as fluorinated alcohols, acids or ketones may be used, but the organic fluorine compound is not limited thereto. These compounds may have an ethylenically unsaturated group in the molecule. These compounds may be used singly or as a mixture of two or more kinds thereof.

When the above organic fluorine compound is used, the content of the organic fluorine compound is preferably 0.1 to 10% by volume, and more preferably 0.1 to 5% by volume based on the total amount of gas to be supplied to the discharge space, in that a uniform layer is formed on a substrate by discharge plasma treatment.

When the organic fluorine compound is gas at ordinary temperature and ordinary pressure, it can be used as it is in the mixed gas, wherein the method of the invention can be carried out most easily. When the organic fluorine compound in the invention is liquid or solid at ordinary temperature and ordinary pressure, it may be used as gas in which the compound is gasified by heating or under reduced pressure, or as a solution in which the compound is dissolved in an appropriate solvent.

When the above titanium compound is used in the reactive gas, the content of the titanium compound is preferably 0.01 to 10% by volume, and more preferably 0.01 to 5% by volume based on the total amount of gas to be supplied to the discharge space, in that a uniform layer is formed on the substrate by the discharge plasma treatment.

As the silicon compound or titanium compound described above, a metal hydride compound or a metal alkoxide compound is preferably used in view of handling, and the alkoxide compound is more preferably used, since it is not corrosive, and generates no harmful gas nor causes contamination.

When the silicon compound or titanium compound is supplied to a discharge space or a discharge space between the electrodes, both compounds may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. When the silicon compound or the titanium compound gasified by heating is used, a metal alkoxide such as tetraethoxysilane or titanium tetraisopropoxide, which is liquid at ordinary temperature and has a boiling point of not more than 200° C., is suitably used in order to form an anti-reflection layer. The above metal alkoxide may be diluted with another solvent. The solvents include an organic solvent such as methanol, ethanol, n-hexane or a mixture thereof. Since these solvents are decomposed during discharge plasma treatment, their influence on layer formation on the substrate or on composition of the formed layer during discharge plasma treatment can be neglected.

As the above described silicon compound, for example, an organometallic compound such as dimethylsilane or tetramethylsilane, a metallic hydride such as monosialne or disilane, a metal halide such as dichlorosilane or trichlorosilane, an alkoxysilane such as tetramethoxysilane, tetramethoxysilane or dimethyldiethoxysilane, or an organosilane is preferably used. The silicon compound used in the invention is not limited thereto. These compounds may be used singly or as a mixture of two or more kinds thereof.

When the above silicon compound is used in the mixed gas, the content of the silicon compound in the mixed gas is preferably 0.01 to 10% by volume, and more preferably 0.01 to 1% by volume, based on the total amount of gas to be supplied to the discharge space, in that a uniform layer is formed on a substrate by the discharge plasma treatment.

As the above described titanium compound, for example, an organometallic compound such as tetradimethylamino titanium, a metal hydride compound such as titanium tetrahydride or dititanium hexahydride, a metal halide compound such as titanium dichloride, titanium trichloride or titanium tetrachloride, or a metal alkoxide compound such as titanium tetraethoxide, titanium tetrapropoxide or titanium tetrabutoxide is preferably used. The titanium compound used in the invention is not limited thereto.

When an organometallic compound is added to a reactive gas, the organometallic compound contains a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, -Er, Tm, Yb, and Lu, and the organometallic compound is preferably one selected from a metal alkoxide, an alkylated metal, and a metal complex.

The reactive gas contains a component for forming a layer such as a gas of the organometallic compound or the organic compound described above, but may contain the component described above as the compound which is contained in the inert gas. That is, the components include inert gas belonging to group XVIII in the periodic table, nitrogen, and a component as a reaction accelerating gas selected from oxygen, ozone, hydrogen peroxide, carbon dioxide, carbon monoxide, hydrogen, nitrogen, water vapor, nitrogen oxides, and ammonia. The content of these components at the discharge space is the same as that denoted above in the inert gas.

Next, an atmospheric pressure plasma treatment method employing the atmospheric pressure plasma treatment apparatus as shown in FIG. 1 will be explained.

Substrate 1 is conveyed to a discharge space between the voltage application electrodes 2a and 2b and the ground electrode 5 for supporting the substrate by a conveying means (not illustrated) such as a belt conveyer.

A reactive gas is introduced into the path 11 for the reactive gas, and an inert gas into the paths 12a and 12b for the inert gas, while the walls 14a and 14b of the gas path are optionally heated by the temperature controlling systems 13a and 13b. Each gas is supplied to a discharge space between the voltage application electrodes 2a and 2b and the ground electrode 5, that is, a discharge space, and a high frequency voltage is applied across the discharge space at atmospheric pressure or approximately atmospheric pressure, employing a high frequency power source 8 to generate discharge plasma. The substrate 1, conveyed by the belt conveyer, is plasma treated to form a layer, and further conveyed outside the discharge space by the belt conveyer. The substrate 1 may be plasma treated while being transported.

Figure 2:
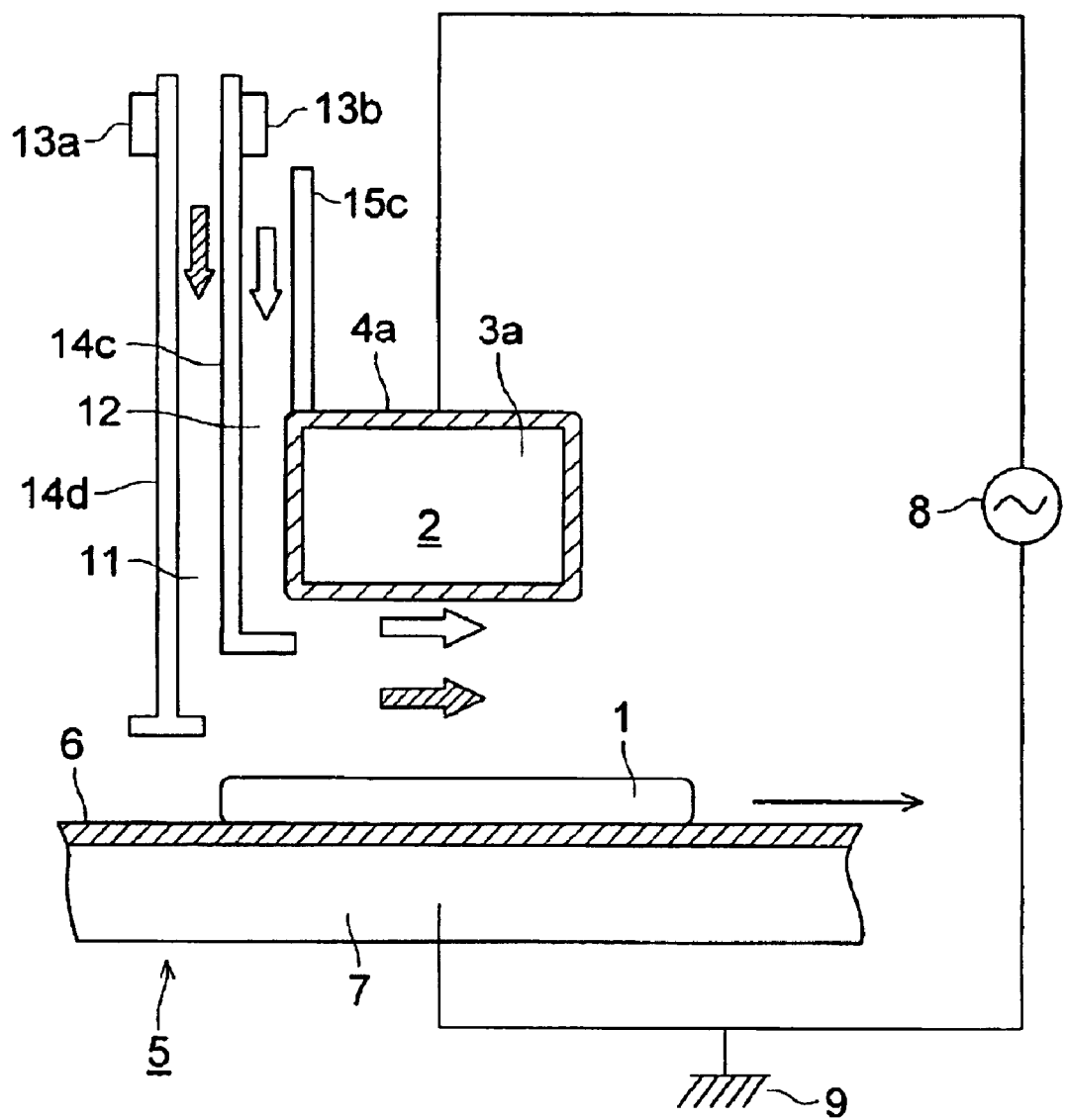
FIG. 2 is a sectional view of another embodiment of the gas supply section and the electrode section of the atmospheric pressure plasma treatment apparatus of the invention.

FIG. 2 is a sectional view of another embodiment of the gas supply section and the electrode section of the atmospheric pressure plasma treatment apparatus of the invention. In FIG. 2, the same numerical numbers as in FIG. 1 represent the same as those represented in FIG. 1. Numerical number 2 represents a voltage application electrode (a first electrode), numerical number 11 represents a gas path (a reactive gas supply means) for supplying the reactive gas to the discharge space, which is comprised of walls 14c and 14d of the gas path. Numerical numbers 12 represents a gas path (an inert gas supply means) for supplying the inert gas to the discharge space, which is comprised of walls 14c and 15c of the gas path.

In FIG. 2, substrate 1 is conveyed to a discharge space between the voltage application electrodes 2a and 2b and the ground electrode 5 for supporting the substrate by a conveying means (not illustrated) such as a belt conveyer.

A reactive gas is introduced into the path 11 for the reactive gas (hatched arrow), and an inert gas into the path 12c for the inert gas (hollow arrow), while the walls 14a and 14b of the gas path are optionally heated by the temperature controlling systems 13a and 13b. The temperature of the reactive gas heated is preferably higher than temperature at which the reactive gas gives a saturated vapor pressure at its concentration. Each gas is supplied to a discharge space between the voltage application electrode 2 and the ground electrode 5, and a high frequency voltage is applied across the discharge space at atmospheric pressure or approximately atmospheric pressure, employing a high frequency power source 8 to generate discharge plasma. The substrate 1, conveyed by the belt conveyer, is plasma treated to form a layer.

In FIG. 2, the reactive gas and the inert gas flow from the upper left to the discharge space, pass through the space, and are exhausted to the right side. The gas is supplied to the substrate surface in the one direction at a constant gas flow speed. The voltage application electrode is provided so that the electrode is surrounded with the gas paths, whereby turbulent flow is difficult to occur in the discharge space, the inert gas contacts the voltage application electrode 2, and the reactive gas contacts the surface of the substrate 1. The above structure of the electrode section is such that the voltage application electrode 2 does not directly contact the reactive gas for forming a layer and the ground electrode 5 is covered with the surface 1, produces no contamination on the electrode surface and can form a layer efficiently. The substrate 1 with the formed layer is further conveyed outside the electrode section through the belt conveyer. The substrate 1 may be plasma treated while transporting.

Figure 3:
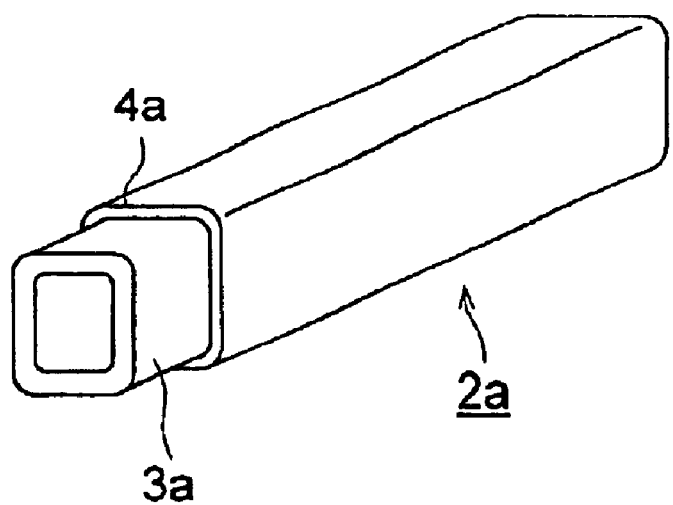
FIG. 3 is one embodiment of a fixed prismatic electrode which can be used in the invention.

FIG. 3 shows one embodiment of a voltage application electrode which can be used in the invention. FIG. 3 shows a perspective view of one embodiment of a prismatic, fixed electrode. A voltage application electrode 2a is an electrode in which the metal base material 3a comprised of a hollow stainless steel is coated with ceramic dielectric layer 4a as a dielectric layer, the coating being carried out by thermally spraying ceramic to form a ceramic layer, and sealing the ceramic layer with an inorganic material. This electrode can be used in the voltage application electrodes 2a, 2b and 2 in FIG. 1 or 2. In FIG. 2, the entire surface (four sides) of the electrode is covered with a dielectric layer, but only the discharge surface or its surroundings may be coated with a dielectric layer.

Figure 4:
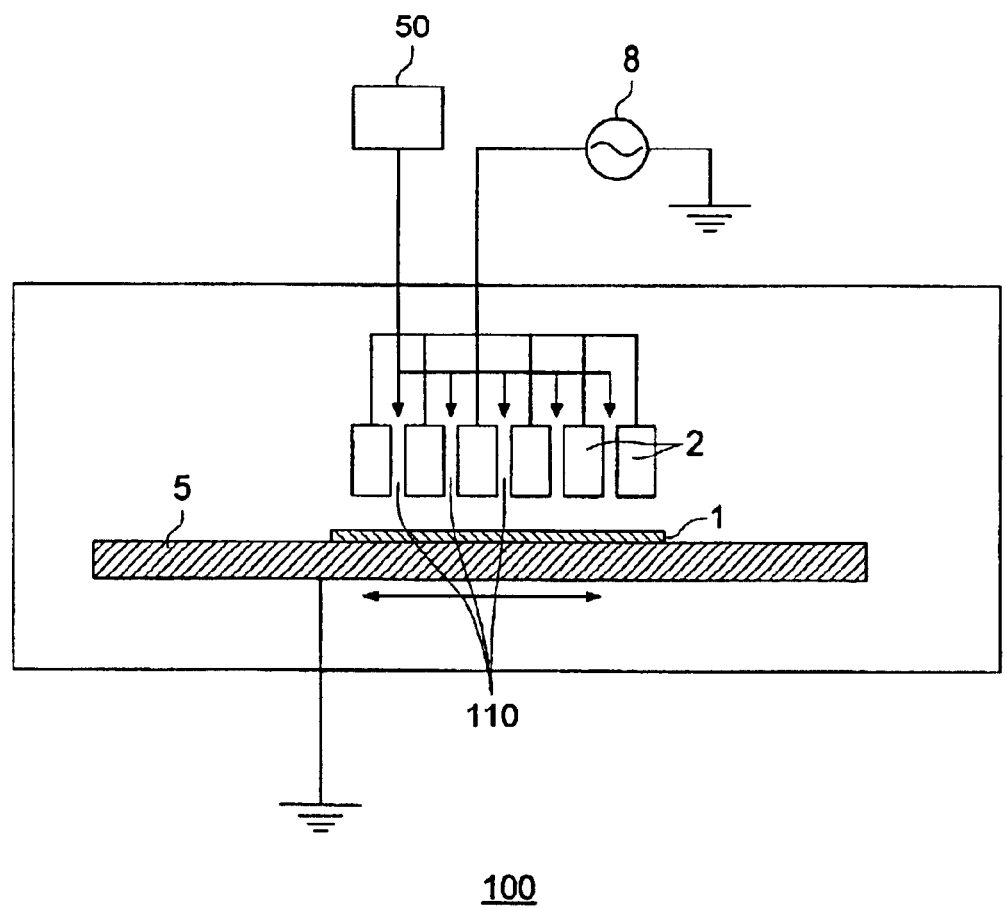
FIG. 4 is a schematic view of the atmospheric pressure plasma treatment apparatus of the invention in which planar electrodes are used.

FIG. 4 is a schematic view of an atmospheric pressure plasma treatment apparatus in which plural planar voltage application electrodes (first electrodes) and a planar ground electrode (a second electrode) are in parallel with each other and are provided so as to insert the same plane. The atmospheric pressure plasma treatment apparatus 100 comprises a high frequency power source 8, plural voltage application electrodes 2 and a ground electrode 5 as voltage application means, the plural planar voltage application electrodes 2 and the ground electrode 5 being opposed to each other and provided so as to insert the same plane.

The voltage application electrodes 2 fixed plural prismatic electrodes are arranged horizontally with an interval. The interval between the two neighboring two of the electrodes constitutes a gas path 110 as a gas supply means. The reactive gas and the inert gas are introduced from a gas supply section 50 to the gas path 110, and supplied to the ground electrode 5 covered with the substrate 1 (form the upper to the lower in FIG. 4).

The ground electrode 5 is grounded. The substrate 1 is provided on the ground electrode and horizontally reciprocated. Therefore, by moving the ground electrode 5, a layer can be formed on the surface of a substrate greater in size than the discharge surface area. Herein, the described in FIG. 1 or FIG. 2 above regarding the electrode section and the gas introduction section applies to the relationships among the voltage application electrodes 2, the ground electrode 5 and the gas path 110.

Figure 5:
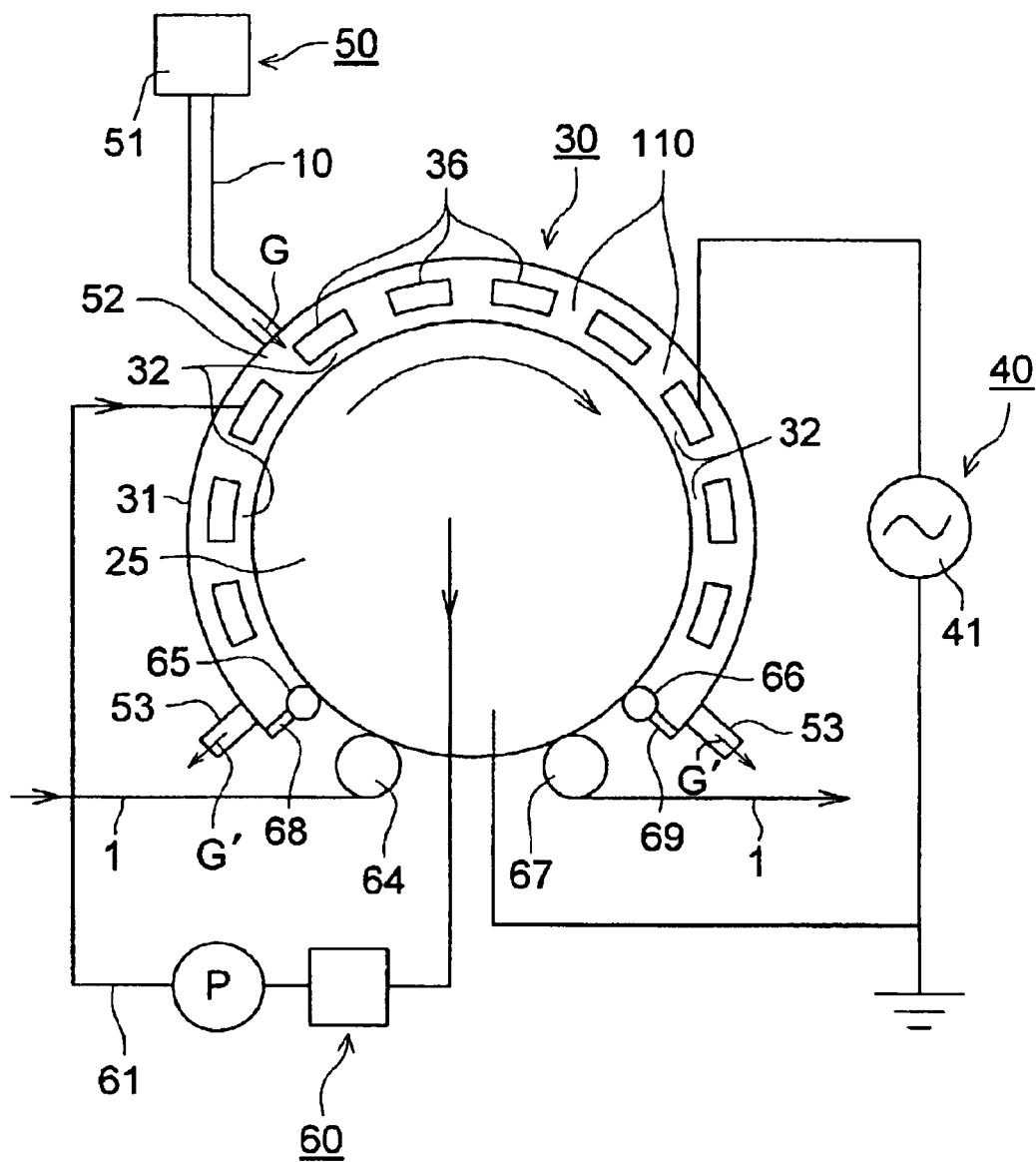
FIG. 5 is a schematic view of one embodiment of the atmospheric pressure plasma treatment apparatus of the invention in which a roll electrode is used.

FIG. 5 is a schematic view showing another embodiment of the atmospheric pressure plasma treatment apparatus of the invention. FIG. 5 comprises an atmospheric pressure plasma discharge treatment apparatus 30, a gas supply section 50, a high frequency power source 40, and an electrode temperature adjusting means 60 as a cooling means. In FIG. 5, the roll electrode 25 (ground electrode) and fixed plural prismatic electrodes 36 (voltage application electrode) are employed, which correspond to the ground electrode 25 and the fixed voltage application electrodes 2a and 2b being opposed to each other in FIG. 1 or 2, respectively, where the substrate 1 in the film form is subjected to plasma discharge treatment. The substrate 1 is conveyed from a preceding process or from a stock roll which is not illustrated, passed through guide roller 64 and through nip roller 65, which removes any air accompanying the substrate 1, transported to a discharge space between the fixed plural prismatic electrodes 36 and the roll electrode 25 so that the substrate contacts the surface of the roll electrode, and then transported through nip rollers 66 and guide roller 67 to the uptake roller, which is not illustrated, or the next process. Numerical numbers 68 and 69 are partition plates for separating the plasma discharge vessel 31 from the exterior.

A gas G (including a reactive gas and inert gas) are generated in gas generating device 51 of the gas supply section 50, supplied from gas supply port 52 having a structure of the gas paths 11, 12a, and 12b as shown in FIG. 1 or of the gas paths 11, and 12 as shown in FIG. 2 to plasma discharge vessel 31, the gas supply amount being controlled, and supplied to a discharge treatment section 32 (discharge space). Waste gas G' is exhausted from exhaust port 53. In FIG. 5, only one gas introduction section 10 and only one waste gas exhaust port 53 are shown, but they are preferably provided to be directed to each of intervals between the two adjacent fixed prismatic electrodes 36 in order to uniformly supply the gas and uniformly exhaust the waste gas. Voltage is applied to the fixed prismatic electrodes 36 by means of a high frequency power source 41, which is voltage application means 40, and roll electrode 25 is grounded, whereby plasma is generated. Although not illustrated in FIG. 5, a high frequency voltage is applied to each of the fixed prismatic electrodes 36 through the respective voltage application means 40 from a high frequency power source 41. A heated or chilled medium can be supplied to the roll electrode 25 and the fixed prismatic electrodes 36, employing electrode temperature adjusting means 60. The medium whose temperature is adjusted by the electrode temperature adjusting means 60 is supplied through tube 61 to the interior of the roll electrode 25 or the fixed prismatic electrodes 36 employing a pump P to adjust their temperature. In FIG. 5, a tube for returning the medium from each electrode is not illustrated. Physical properties and composition of a layer formed on a substrate by plasma discharge treatment may vary due to temperature of the substrate, and it is preferred that the substrate temperature is properly controlled.

As the medium, gas such as air can be used, and insulating materials including distilled water or oil such as silicon oil are preferably used. The temperature of the substrate varies due to treating conditions, but is ordinarily from room temperature to 350° C. It is desired that the temperature of the roll electrode be controlled during the plasma discharge treatment in order to minimize temperature unevenness in the width and longitudinal directions of the substrate.

Figure 6:
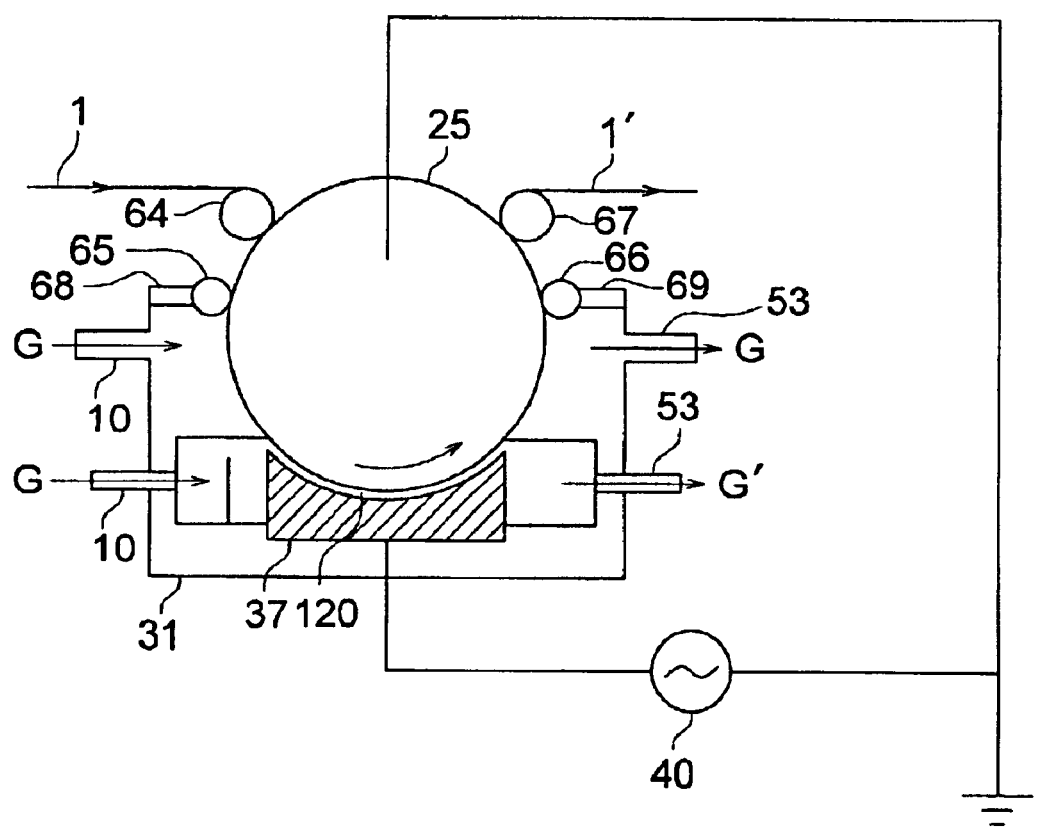
FIG. 6 is a schematic view of another embodiment of the plasma discharge treatment apparatus of the invention in which a roll electrode is used.

FIG. 6 shows a schematic view of another embodiment of the plasma discharge treatment apparatus of the invention. In FIG. 1, a long length film substrate is used as a substrate.

A gap (discharge space) 120 between a voltage application electrode 37 (a first electrode) and a ground electrode 25 (a second electrode) is charged with a gas G. The substrate 1 is conveyed from a stock roll which is not illustrated or from a preceding process, guided by a guide roller 64, and passes through the discharge space (discharge space) 120 while the substrate is wound around the ground electrode 25, where the substrate 1 is subjected to plasma discharge treatment at atmospheric pressure or approximately atmospheric pressure.

When a layer is formed on a film as the substrate, which is provided at the gap (discharge space) between the opposed electrodes, the thickness of the film is suitably from 1 to 200 $\mu$m. When the film is provided in contact with the second electrode, the distance between the film surface on the first electrode side and the first electrode surface is preferably not more than 5 mm, more preferably not more than 3 mm, and still more preferably 0.5 to 2 mm.

Discharge plasma is generated by applying voltage across the discharge space between the opposed electrodes from a high frequency power source 40. Voltage applied to the voltage application electrode 37 and the ground electrode 25 is properly determined. As a high frequency power source, those described above are used. It is preferred in the invention that a high frequency electric field having a frequency of from 50 kHz to 150 MHz is applied across the discharge space between the opposed electrodes. Supplying, to the discharge space, power of not less than 1 W/cm$^2$ at a high frequency voltage exceeding 100 KHz, a gas in the discharge space is excited to generate plasma. Application of such a high power electric field can provide a layer with high density, with a uniform thickness and with high performance, or an improved substrate surface at high production efficiency. In the invention, a frequency of the high frequency voltage applied across the discharge space between the opposed electrodes is preferably not more than 150 MHz. The frequency of the high frequency voltage is preferably not less than 200 kHz, and more preferably not less than 800 kHz. Power supplied across the discharge space between the opposed electrodes is preferably not less than 1.2 W/cm$^2$, and the power is preferably not more than 50 W/cm$^2$, and more preferably not more than 20 W/cm$^2$. The area (cm$^2$) of the opposed electrodes at which voltage is applied refers to the area at which discharge occurs. The surface of the electrode where discharge occurs refers to a discharge surface, and a space between the discharge surfaces refers to also a discharge space. The high frequency voltage applied to the electrodes may be a continuous sine wave or a discontinuous pulsed wave. The continuous sine wave is preferred in securing the effects of the invention. Herein, as a voltage applying method, either a continuous oscillation mode (called a continuous mode) with a continuous sine wave or a discontinuous oscillation mode (called a pulse mode) carrying ON/OFF discontinuously may be used, but the continuous mode is preferred in obtaining a layer with high density and high quality.

In the invention, the above discharge is carried out at atmospheric pressure or approximately atmospheric pressure, and "atmospheric pressure or approximately atmospheric pressure" herein implies a pressure of 20 kPa to 200 kPa. In order to obtain the effects as described in the invention, the pressure is preferably 93 kPa to 104 kPa. In the invention, plasma discharge treatment can be carried out without being shielded from the atmosphere, but is preferably carried out being shielded from the atmosphere. As a method in which the treatment is carried out shielded from the atmosphere, there is a method in which a closed vessel or a means such as a nip roller for eliminating air accompanied by a transported substrate is used. As a means for eliminating air accompanied by a transported substrate, a nip roller is effective, and the substrate 1 guided by a guide roller 64 is pressed on the ground electrode 25 applying pressure to a nip roller 65, whereby air accompanied by the substrate can be eliminated. Although a nip roller is sufficient to eliminating air accompanied by a transported substrate 1, a preliminary chamber for eliminating the air accompanied by the substrate is preferably provided as a means for eliminating the air, upstream a plasma discharge vessel 31 of the plasma discharge treatment apparatus shown in FIG. 6, into which the substrate 1 is transported.

As the preliminary chamber, a chamber as disclosed in Japanese Patent O.P.I. Publication No. 2000-072903 can be used. The internal pressure in the vessel is required to be higher than that in the preliminary chamber, and the former is preferably 0.3 Pa or more higher than the latter. This difference in internal pressure between the vessel and the preliminary chamber can eliminate the external air, makes it possible to employ the reaction gas effectively, and improves the effects due to the treatment. When two or more preliminary chambers are provided on each side of a gas supply port and a waste gas exhaust port, adjacent to the plasma discharge vessel, the internal pressure in the preliminary chamber nearer to the vessel of the two nearest preliminary chambers is higher than that of the other preliminary chamber, and the former is preferably not less than 0.3 Pa higher than the latter. Such a difference in internal pressure between the plural preliminary chambers can eliminate the external air more efficiently, makes it possible to employ the reaction gas more effectively, and further improves the effects due to the treatment.

In FIG. 6, the substrate 1 is pressed on the ground electrode by the nip roller 65 so that the substrate contacts the first electrode, and introduced to the vessel 31. The gas G is introduced into the vessel 31 from a gas supply port 10, and the gas G is also introduced into the discharge space (discharge space) 120. After the discharge treatment, waste gas G' is exhausted from an exhaust port 53. The substrate 1 after the treatment is delivered from the vessel 31 through a nip roller 67, and then transported through a guide roller 67 to the uptake roller, which is not illustrated, or the next process.

The interior of the vessel 31 is shielded from the atmosphere by nip rollers 64 and 66 and partition plates 68 and 69. The vessel may be a vessel of pyrex (R) glass, or a vessel comprised of aluminum or stainless steel frame whose internal surface is laminated with a polyimide resin or a vessel comprised of the metal frame whose internal surface is thermally sprayed with ceramic to form an insulation layer on the surface. A vessel of metal may be used if insulation from the electrodes is secured. Stable plasma treatment can be secured by surrounding the gap (discharge space) 120 in the vessel 31 so as to cover the sides of the opposed electrodes and the substrate transporting section, which is preferable. The gas G introduced into the vessel 31 from the gas supply port 10 is exhausted from an exhaust port 53.

The invention is characterized in that the plasma discharge treatment is carried out in a gap (discharge space) 120 between the substrate 1 on the ground electrode 25 and the voltage application electrode 37, while supplying the reactive gas to the gap so that the substrate surface is covered with the reaction gas, and supplying the inert gas to the gap 120 so that the voltage application electrode surface is covered with the inert gas.

The reactive gas and inert gas are supplied through the respective gas supply means, separately, so that the reactive gas covers the surface of the substrate transported onto the ground electrode and the inert gas covers the surface of the voltage application electrode. When the reaction gas and inert gas are completely mixed in the discharge space, undesired contamination of the voltage application electrode is produced. That is, it is preferred that the location rich in the reactive gas and the location rich in the inert gas in the gap between the two electrodes are present in the inert gas in the gap between the two electrodes. It is most preferred that the reactive gas and the inert gas each form a laminar flow.

In the invention, the flow of the reaction gas and inert gas will be explained below employing a figure, in which the opposed electrodes having a curved surface is replaced with those with a plane surface.

Figure 7:
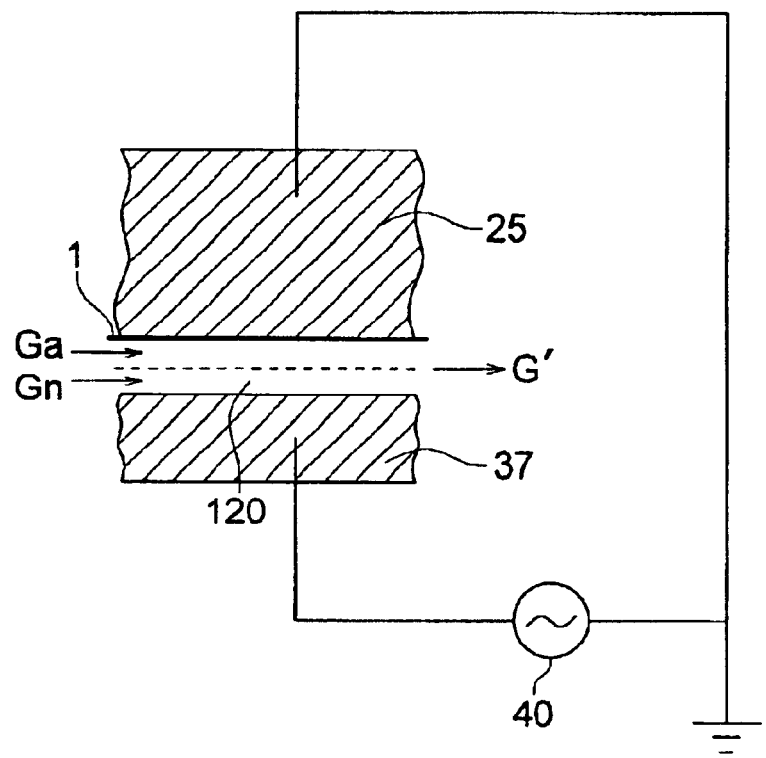
FIG. 7 shows the state, in which the reactive gas and inert gas each flows between the opposed electrodes, separately, so that the reaction gas covers the substrate surface and the inert gas covers the voltage application electrode.

FIG. 7 shows the state, in which the reactive gas Ga and inert gas Gn each flows between the opposed electrodes, separately, so that the reaction gas Ga covers the substrate surface and the inert gas Gn covers the voltage application electrode. FIG. 7 shows the state in which the reactive gas Ga flows so as to cover the surface to be treated of the substrate 1 transported while contacting the ground electrode 25, and the inert gas Gn flows so as to cover the surface of the voltage application electrode 37, wherein the substrate is plasma treated. In FIG. 7, the reactive gas Ga and the inert gas Gn flow divided by a broken line, but flow of the gas is not limited to this, as long as the reactive gas flow does not directly contact the voltage application electrode.

The state of the reactive gas and the inert gas in the discharge space may be one in which either the reactive gas or the inert gas is present as an extremely boundary film on the substrate surface or the second electrode surface or one having a concentration gradient such that a concentration of the reactive gas present at a position closer to the voltage application electrode is lower. The inert gas covering the voltage application electrode may contain the reactive gas in an extremely slight amount, as long as contamination does not occur on the voltage application electrode surface.

In the invention, even when the reactive gas and the inert gas are introduced in the discharge space, separately, and plasma discharge treatment of the substrate is carried out due to application of a high frequency voltage, the plasma treatment is sufficient, and no contamination on the voltage application electrode surface is observed, and if any, only slight contamination on the voltage application electrode surface is observed, which has no influence on continuous operation, resulting in improved production efficiency.

Next, the electrode used in the atmospheric pressure plasma treatment apparatus of the invention, which is explained in FIG. 6, will be explained.

In the invention, it is preferred that a substrate is transported at the same speed as the rotational speed of the ground electrode (the first electrode), since the substrate is plasma treated while transporting. As the voltage application electrode (the first electrode), an electrode with a plane surface can be used, but since it is likely to produce scratches on the surface side contacting the electrode, a rotational roll electrode is preferable. As is shown in FIG. 6, the voltage application electrode 37, which is fixed, has a concave surface, which is approximately in parallel with the curved surface of the ground electrode 25 in the roll form. The voltage application electrode 37 is fixed. The arc length of the voltage application surface is not specifically limited, as long as the arc length is equal to or less than that of the curved surface of the ground electrode 25. The arc length of the surface of the voltage application electrode 25 is preferably in the range of from 10 to 50% of the circumference of the ground electrode 25.

The electrode used in the invention is comprised of a metal base material and a dielectric covering the metal base material. The metal base material of for example, the rotational ground electrode is preferably cylindrical.

Figure 8:
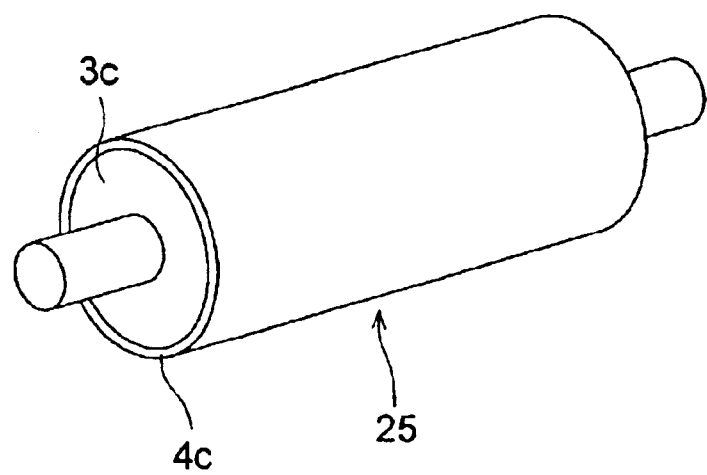
FIG. 8 is a perspective view of one embodiment of a ground electrode which is in the roll form and rotatory.

FIG. 8 is a schematic view of a ground electrode which is in the roll form and rotatory. The ground electrode 25 is comprised of a metal base material 3c and a dielectric 4c, as shown in FIG. 8. The metal base material 3c is preferably jacket-type controlling temperature of the electrode. The metal base material and dielectric are the same as denoted above.

Figure 9:
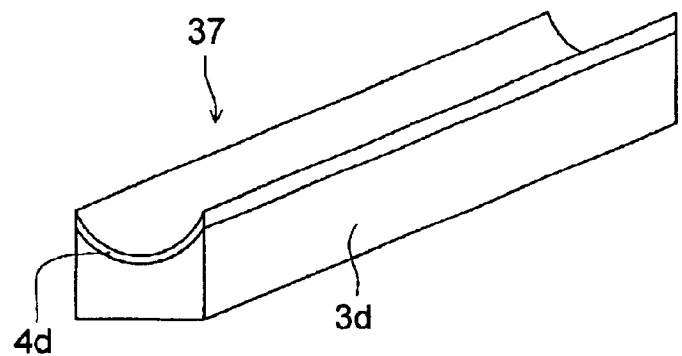
FIG. 9 is a perspective view of one embodiment of a voltage application electrode.

FIG. 9 is a schematic view of one embodiment of the voltage application electrode. In FIG. 9, the voltage application electrode 37 has a concave surface, which is provided in parallel with the surface of the ground electrode 25 of FIG. 8. In the voltage application electrode 37, a metal base material 3d is preferably coated with a dielectric 4d. Materials for the metal base material and the dielectric are the same as those denoted above.

As a gas supply means for supplying a reactive gas and inert gas to the discharge space of the atmospheric pressure plasma treatment apparatus of the invention, a reactive gas supply port and an inert gas supply port are provided upstream the entrance of the discharge space, separately.

Figure 10:
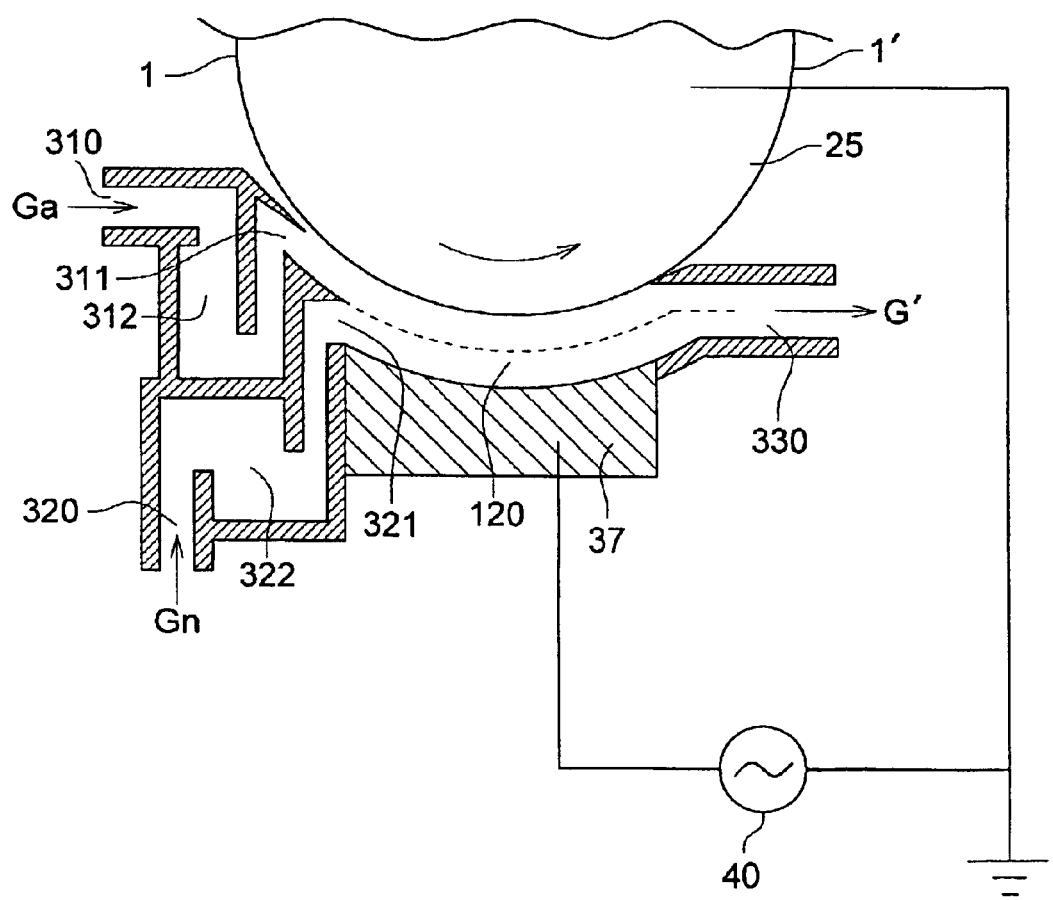
FIG. 10 is a schematic view of one embodiment of the atmospheric pressure plasma treatment apparatus of the invention in which the gas supply means for supplying a reactive gas and inert gas to the discharge space are shown in detail.

FIG. 10 is a schematic view of one embodiment of the atmospheric pressure plasma treatment apparatus which has a gas supply means for supplying a reactive gas and inert gas to the discharge space. In FIG. 10, a reactive gas Ga is introduced through an introduction nozzle 311 from a gas supply port 310, supplied to the discharge space 120, flows with a substrate 1 to cover the surface of the substrate 1 transported while contacting the ground electrode 25, and, after treatment of the substrate, is exhausted from an exhaust port 330 as a waste gas G'. On the other hand, inert gas Gn is introduced through an introduction nozzle 321 from a gas supply port 320, supplied to the discharge space 120, flows along the surface of the voltage application electrode 37 to cover the surface of voltage application electrode 37, and, after treatment of the substrate, is exhausted from an exhaust port 330 as a waste gas G'. The tip of the introduction nozzles 311 and 321 is preferably blade-shaped. It is preferred that suction is applied at the exhaust port 330 in such a manner that gas flow is not turbulent, and is in the state of slightly reduced pressure. Numerical numbers 312 and 322 are gas paths. Herein, the gas supply port 310, an introduction nozzle 311, and gas path 312 are reactive gas supply means, and the gas supply port 320, an introduction nozzle 321, and gas path 322 are inert gas supply means. Numerical number 40 is a high frequency power source.

Figure 11:
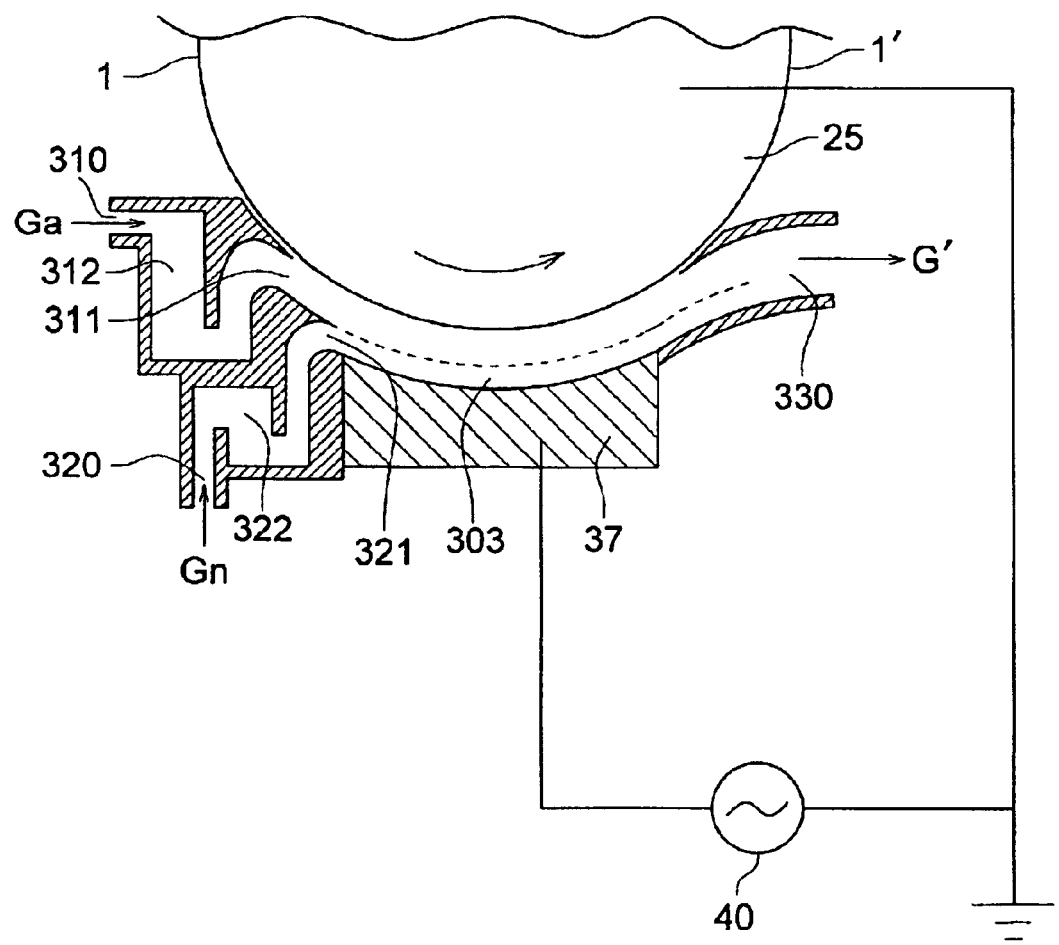
FIG. 11 is a schematic view of another embodiment of the atmospheric pressure plasma treatment apparatus of the invention in which the gas supply means for supplying a reactive gas and inert gas to the discharge space are shown in detail.

FIG. 11 is a schematic view of one embodiment of the atmospheric pressure plasma treatment apparatus having a means for supplying a reactive gas and inert gas to the discharge space. FIG. 11 is the same as FIG. 10, except that the inner wall of the introduction nozzles 311 and 321 has a curved surface. The introduction nozzles 311 and 321 of FIG. 10 are preferable, since a gas is likely to be formed as a laminar flow. The apparatuses of the above FIGS. 10 and 11 above are embodiments in which two layers of inert gas and reaction gas are supplied to the discharge space, but three gas layers or gas layers having a concentration gradient may be used. Three or more of each of an introduction port and an introduction nozzle are provided on the apparatus of FIG. 10 or FIG. 11.

In the invention, the orifice width of the introduction nozzle is determined due to a supplying amount of the inert gas and the reactive gas supplied to a discharge space between the substrate and the surface of the voltage application electrode in the treatment section. In this case, the flow rates of the inert gas and the reactive gas are preferably the same. The flow rate of the gas on the substrate side may be almost the same as the transport speed of the substrate, but the flow rate of the gas on the voltage application electrode side is a little higher than the transport speed of the substrate, or the flow rate of the gas on the substrate side, since the flow rate of the gas on the voltage application electrode side is zero at the voltage application electrode surface. As is described above, it is preferred that the flow rate of gas on the substrate side, gas between gas layers, and gas on the voltage application electrode side is controlled so as not to cause turbulent flow.

In the invention, the transporting rate of a substrate is preferably 0 to 100 m/minute, and more preferably 0.5 to 50 m/minute. The transporting rate of 0 herein implies that the substrate is still, and a still substrate in the form of sheet, plate or cubic may be subjected to plasma treatment.

In the invention, in order to flow each of a reactive gas and inert gas substantially as a layer in the discharge space, a suitable method is used. As the method, there is a method in which each gas flows at the same speed in the same direction, a method in which the gas flow rate is the same as the transporting rate of the substrate, or a method in which when the transport rate of the substrate is high, the flow rate of the gas on the voltage application side is higher that that of the gas on the substrate side.

In the above method, the reaction gas always flow on the surface of the substrate, and the substrate is subjected to plasma treatment to form a layer on the surface, while the voltage application electrode is covered with the inert gas, no contamination resulting from the reactive gas occurs, and therefore, no contamination on the surface of the voltage application electrode, even when plasma treatment is carried out over a long term.

When a layer is formed on a substrate employing an atmospheric pressure plasma treatment apparatus, the substrate may be electrically charged and dust may be statically adhered to the substrate, but this is no longer a problem according to the method described above.

EXAMPLES

The present invention will be explained below employing examples, but is not limited thereto.

Example 1

<<Preparation of Substrate>>

A cellulose ester film as a substrate was prepared according to the following procedure:

[Preparation of Dope]

<Preparation of Silicon Oxide Dispersion Liquid>

| | |
|---|---|
| Aerosil 200V (produced by Nihon Aerosil Co., Ltd.) | 1 kg |
| Ethanol | 9 kg |

The above composition was mixed with stirring in a dissolver for 30 minutes, and dispersed in a Manton Gaulin type high pressure disperser to obtain a silicon oxide dispersion liquid.

<Preparation of Addition Solution>

| | |
|---|---|
| Cellulose triacetate (acetyl substitution degree: 2.65) | 6 kg |
| Methylene chloride | 140 kg |

The above composition was incorporated in a sealed vessel, heated with stirring, and filtered to obtain a solution. The resulting solution was added with stirring to 10 kg of the above-obtained silicon oxide dispersion liquid, stirred for additional 30 minutes, and filtered to obtain an addition solution.

<Preparation of Base Dope>

| | |
|---|---|
| Methylene chloride | 440 kg |
| Ethanol | 35 kg |
| Cellulose triacetate (acetyl substitution degree: 2.65) | 100 kg |
| Triphenyl phosphate | 8 kg |
| Ethylphthalylethylglycolate | 3 kg |
| TINUVIN 326 (produced by Ciba Speciality Chemicals Co. Ltd.) | 0.4 kg |
| TINUVIN 109 (produced by Ciba Speciality Chemicals Co. Ltd.) | 0.9 kg |
| TINUVIN 171 (produced by Ciba Speciality Chemicals Co. Ltd.) | 0.9 kg |

The above dope composition was incorporated in a sealed vessel, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain a base dope.

Subsequently, the addition solution was added to the base dope at an addition rate of 2 kg per 100 kg of the base dope, uniformly mixed in an in-line mixer (a static in-line mixer Hi-Mixer SWJ, produced by Toray Co. Ltd.), and filtered to obtain a Dope.

[Preparation of Cellulose Ester Film]

A cellulose ester film was prepared employing the dope obtained above according to the following procedures.

(Preparation of Cellulose Ester Film 1)

The dope was filtered, and was uniformly cast at a dope temperature of 35° C. on a 30° C. stainless steel belt support to form a web, employing a belt casting apparatus. The web was dried until it could be peeled from the support, and then was peeled from the support. At peeling, the residual solvent amount of the web was 35%.

The peeled web was dried at 115° C. while holding both side edges of the web film, released from the holding, further dried in a dry zone of 120° C. while transported by rollers, and subjected to knurling treatment to give a protrusion with a 5 µm height and a 10 mm width at the both side edges. Thus, cellulose ester film with a thickness of 80 µm was prepared.

[Preparation of Film Substrate]

A film substrate was prepared employing the cellulose ester film prepared above, as follows:

The following coating composition (1) was extrusion coated on one surface a (the surface of the web opposite the surface b contacting the belt support at the dope casting) of the above cellulose ester film to give a wet thickness of 13 µm, and dried in a drying zone of 80° C. to form a back coat layer.

Subsequently, the following coating composition (2) was extrusion coated on the other surface b of the above cellulose ester film to give a wet thickness of 13 µm, dried in a drying zone of 80° C., and subjected to ultraviolet light irradiation at 120 mJ/cm² to obtain a clear hard coat layer with a dry thickness of 4 µm and a center line average surface roughness ($R_a$) of 15 nm.

Coating Composition (1) (Back Coat Layer Coating Composition)

| Acetone | 30 parts by weight |
|---|---|
| Ethyl acetate | 45 parts by weight |
| Isopropyl alcohol | 10 parts by weight |
| Diacetyl cellulose | 0.5 parts by weight |
| 2% silica fine particle acetone dispersion liquid (Aerosil 200V, produced by Nihon Aerosil Co., Ltd.) | 0.1 parts by weight |

Coating Composition (2) (Clear Hard Coat Layer Coating Composition)

| Dipentaerythritol hexacrylate monomer | 60 parts by weight |
|---|---|
| Dipentaerythritol hexacrylate dimmer | 20 parts by weight |
| Polymer containing three or more of a unit derived from dipentaerythritol hexacrylate | 20 parts by weight |
| Dimethoxybenzophenone (photoinitiator) | 4 parts by weight |
| Ethyl acetate | 50 parts by weight |
| Methyl ethyl ketone | 50 parts by weight |
| Isopropyl alcohol | 50 parts by weight |

<<Formation of High Refractive Index Layer>>
(Preparation of Sample 1)

The film substrate prepared above was subjected to plasma discharge treatment on the clear hard coat layer side for 10 hours employing an atmospheric pressure plasma treatment apparatus as shown in FIG. 3. Thus, Sample 1 was obtained.

<Gas Used>

Gas A (inert gas): 99.0% of an argon gas, 1.0% of a hydrogen gas

Gas B (reactive gas): a mixture of 99.9% of an argon gas and 0.1% of a tetraisopropoxytitanium gas gasified by a vaporizer produced by Lintex Co., Ltd.

Gas A and gas B were supplied at a gas A to gas B ratio of 2:1.

<Gas Supplying Method>

As is shown in FIG. 1 showing the details of the electrode section of FIG. 5, gas A was introduced into the paths 12a and 12b for inert gas, and gas B introduced into the path 11 for reactive gas, each path being in the slit form. A discharge output of 20 W/cm² with a frequency of 2 MHz was applied across a discharge space between the ground electrode 5 (roll electrode 25 of FIG. 5) and the voltage application electrodes 2a and 2b (fixed prismatic electrode 36 of FIG. 5) employing a high frequency power source produced by Pearl Kogyo Co., Ltd. as a high frequency power source 40. Herein, the gap distance between the roll electrode 25 and the fixed prismatic electrode 36 was 1 mm.

The temperature controlling systems 13a and 13b were operated so as to give a reactive gas temperature of 80° C. Temperature at which the reactive gas contained in the gas A above gives a saturated vapor pressure is about 50° C.

<Constitution of Electrodes>

Constitution of electrodes will be explained below, employing FIG. 1 showing the details of the gas introducing section and the electrode section.

Stainless steel SUS316 was used as the metal base material of the voltage application electrodes 2a and 2b. The surface of the prismatic stainless steel was thermally sprayed with alumina ceramic except for the side surface in the longitudinal direction to form an alumina ceramic layer with a thickness of 1 mm, and the alumina ceramic layer was coated with a coating liquid in which an alkoxysilane monomer was dissolved in an organic solvent, dried and heated at 100° C. to form a dielectric layer.

The dielectric layer was polished to give a smooth dielectric layer having an Rmax of 5 µm.

The resulting dielectric layer had the following characteristics.

The void volume of the dielectric layer was 5% by volume. The SiO2 content of the dielectric layer was 75 mol %. The thickness of the dielectric layer was 1 mm, and had a thickness variation within the range of ±1%. The specific dielectric constant of the dielectric layer was 10. The difference in thermal linear expansion coefficient between the metal base material and the dielectric layer was $9.6 \times 10^{-6}/°C$.

The side surface without the dielectric layer was arranged outside the chamber so that it did not contact the gas introduced, and high voltage was applied to the side surface.

Regarding the ground electrode 5 supporting the substrate, the whole surface contacting the substrate and the side surface of the roll electrode were treated in the same manner as above to prepare a roll electrode.

The constitution of each electrode is shown in FIG. 3. The metal base material of each electrode is hollow so that chilled water can be circulated in the interior. Continuous processing was carried out employing 25° C. Water.

(Preparation of Samples 2 through 4)

Samples 2 through 4 were prepared in the same manner as in Sample 1, except that a mixed gas containing inert gas (gas A) and reactive gas (gas B) at a gas A to gas B ratio of 2:1 was equally supplied to the paths 12a and 12b for inert gas and the path 11 for reactive gas without supplying gas A and gas B, separately, and the chilled water temperature of each electrode was varied as shown in Table 1.

(Evaluation)

<Condensate on the Electrodes>

After the film substrate was subjected to the plasma treatment, condensates or contaminants on the surface of each electrode were visually observed, and evaluation was carried out according to the following criteria.

A: No condensates or contaminants were observed.
B: A few condensations were observed, but not problematic for practical use.
C: Condensates or contaminants were observed, which was a little problematic for practical use.
D: Apparent condensates or contaminants were observed, which was problematic for practical use.

<Measurement of Layer Thickness and Layer Thickness Distribution>

The thickness of the layer formed on the samples immediately after the beginning of the plasma treatment and after 10 hour's plasma treatment was measured. The thickness at 100 points of the layer was measured, and the average thickness was computed. The average of the absolute value |Δhd| of the difference between the thickness and the average thickness was determined, and the layer thickness distribution was obtained from the following equation. Layer thickness distribution=Average of |Δhd|×100 (%)/Average thickness The results are shown in Table 1.

TABLE 1

| Sample No. | Gas supply | Temperature of chilled water for cooling electrodes (° C.) | Immediately after the beginning of plasma treatment | | After 10 hours' plasma treatment | | Remarks |
|---|---|---|---|---|---|---|---|
| | | | Condensates | Layer thickness distribution (%) | Condensates | Layer thickness distribution (%) | |
| 1 | supplied separately | 25 | A | 0.3 | A | 0.8 | Inv. |
| 2 | supplied as a mixture | 25 | C | 18.2 | D | 37.6 | Comp. |
| 3 | supplied as a mixture | 100 | B | 6.45 | D | 16.7 | Comp. |
| 4 | supplied as a mixture | 120 | B | 5.17 | D | 14.9 | Comp. |

Inv.: Invention, Comp.: Comparative

As is apparent from Table 1, the sample of the invention, which was prepared by subjecting the film substrate to plasma treatment while supplying inert gas and reactive gas, separately, provided excellent layer thickness distribution even when continuous plasma treatment was carried out for long time, and the method of the invention produced no condensates on the surface of the electrodes even when continuous plasma treatment was carried out for long time.

Example 2

Sample 1 prepared in Example 1 above was subjected to plasma discharge treatment in the same manner as Sample 1 in Example 1, except that the following gas B was used instead of the gas B used in Example 1. Thus, Sample 5 with a low refractive index layer was obtained.

Sample 2 prepared in Example 1 above was subjected to plasma discharge treatment in the same manner as Sample 2 in Example 1, except that the following gas B was used instead of the gas B used in Example 1. Thus, Sample 6 with a low refractive index layer was obtained. Gas B: a mixed gas in which 99.8% of an argon gas and 0.3% of a tetraethoxysilane gas gasified by a vaporizer produced by Estec Co., Ltd. were mixed In the above treatment, the supplying amount of each gas was properly adjusted to obtain an intended layer thickness.

Sample 5 prepared above having a low refractive index layer had an average reflectance of 0.8%, and a reflectance distribution of 0.1% (the distribution was obtained from measurements at one hundred points was measured), providing a layer with extremely high uniformity. Sample 5 exhibited excellent results as compared with Comparative sample 6 having an average reflectance of 2.3% and a reflectance distribution of 1.2%.

The reflectance of each sample was measured under condition of a 5° regular reflection through a spectrophotometer TYPE 1U-4000 (produced by Hitachi Seisakusho Co., Ltd.).

Example 3

Sample 7 was prepared in the same manner as Sample 1 in Example 1, except that a frequency of 50 kHz was used instead of a frequency of 2 MHz. Refractive index of Sample 7 was measured according to the following method. The refractive index of Sample 8 was 1.84, while the refractive index n of Sample 1 was 2.25.

Example 4

Sample 8 was prepared in the same manner as Sample 1 in Example 1, except that a discharge output of 75 W/cm$^2$ was used instead of a discharge output of 20 W/cm$^2$. The layer distribution was measured after the ten hour plasma discharge treatment. Sample 8 had a layer distribution of 7.8%, which deteriorated as compared with Sample 1 having a layer distribution of 0.8%.

Example 5

Sample 9 was prepared in the same manner as Sample 1 in Example 1, except that the temperature of the walls for the reactive gas was set at a temperature 10 degree higher than the temperature of the reactive gas. The layer distribution of Sample 1 varied from 0.3% to 0.8% after the ten hour plasma discharge treatment, while the layer distribution of Sample 9 remained to be 0.3% after the ten hours' plasma discharge treatment, showing no change of the layer distribution.

Example 6

[Layer Formation Employing Plasma Discharge Treatment]
<Preparation of Substrate>
<<Preparation of Cellulose Triacetate Film (80 μm)>>
(Preparation of Dope)

| Cellulose triacetate (acetyl substitution degree: 2.87) | 85 kg |
|---|---|
| Methylene chloride | 290 liter |
| Ethanol | 25 liter |
| Aerosil 200V (silica particles) (produced by Nihon Aerosil Co., Ltd.) | 0.12 kg |
| TINUVIN 171 (UV absorber, produced by Ciba Speciality Chemicals Co. Ltd.) | 0.5 kg |
| TINUVIN 109 (UV absorber, produced by Ciba Speciality Chemicals Co. Ltd.) | 0.5 kg |
| TINUVIN 326 (UV absorber, produced by | 0.3 kg |

-continued

| | |
|---|---|
| Ciba Speciality Chemicals Co. Ltd.) | |
| Dicyclohexyl phthate | 10 kg |

(Preparation of Cellulose Triacetate Film)

The dope obtained above was uniformly cast at 30° C. from a die slit onto an endless stainless steel belt support, which was heated on the rear side with 35° C. Water, to form a dope film. The dope film (hereinafter referred to also as web) was blown with 44° C. air and dried. Ninety minutes after the casting, the web was peeled from the support at a residual solvent content of 80% by weight. The temperature at the peel position on the endless stainless steel belt support was set at 11° C. The peeled web was further dried while transported for one minute in a first dry zone set at 50° C., transported for 30 seconds in a second dry zone set at 90° C., in which a tenter drier was employed), and transported for twenty minutes in a third dry zone set at 120° C. In the second dry zone, the web was stretched by a factor of 1.06 in the transverse direction by means of a tenter. Thus, an 80 μm thick cellulose ester film was prepared. The film was wound around a spool to obtain a cellulose ester film in the roll form. The residual solvent content at the winding of the film was less than 0.01% by weight. The residual solvent content is obtained from the following equation.

Residual solvent content (% by weight)={(M−N)/N}×100

Wherein M represents weight of web to be measured, and N represent weight of web after the web is dried at 110° C. for 3 hours.

The following back coat layer (hereinafter referred to also as BC layer) composition and the following clear hard coat layer (hereinafter referred to also as CHC layer) composition were coated on one surface of the above cellulose ester film, and was used for plasma discharge treatment described later.

<<BC Layer Coating>>

Before the CHC layer described later was coated, the following BC layer coating composition was coated on one surface of the above cellulose ester film through a gravure coater to give a wet thickness of 14 μm, and dried at 85° C. to give a BC layer.

(BC Layer Coating Composition)

| | |
|---|---|
| Acetone | 30 parts by weight |
| Ethyl acetate | 45 parts by weight |
| Isopropyl alcohol | 10 parts by weight |
| Cellulose diacetate | 0.5 parts by weight |
| Aerosil 200V | 0.1 parts by weight |

<<CHC Layer Coating>>

The following CHC layer coating composition was coated on the surface of the above cellulose ester film opposite the BC layer through a gravure coater to give a wet thickness of 13 μm, dried at 85° C. at a dry zone, and subjected to ultraviolet light irradiation at 115 mJ/cm² to obtain a CHC layer with a dry thickness of 5 μm and a center line average surface roughness ($R_a$) of 12 nm. Thus, a substrate sample was obtained.

(CHC Layer Coating Composition)

| | |
|---|---|
| Dipentaerythritol hexacrylate monomer | 60 parts by weight |
| Dipentaerythritol hexacrylate dimmer | 20 parts by weight |

-continued

| | |
|---|---|
| Polymer containing three or more of a unit derived from dipentaerythritol hexacrylate | 20 parts by weight |
| Dimethoxybenzophenone (photoinitiator) | 4 parts by weight |
| Propylene glycol monomethylether | 75 parts by weight |
| Methyl ethyl ketone | 75 parts by weight |

<Reactive Gas and Inert Gas>

<<Composition of Reactive Gas Ga>>

| | |
|---|---|
| Inert gas: an argon gas | 97.7% by volume |
| Material gas: tetraisopropoxytitanium vapor (gasified by a vaporizer produced by Rintex Co., Ltd, and mixed with the argon gas) | 0.3% by volume |
| Reaction accelerating gas: a hydrogen gas | 2% by volume |

<<Composition of Inert Gas Gn>>

| | |
|---|---|
| Inert gas: argon | 100% by volume |

<High Frequency Power Source>

Employing the following high frequency power source, samples 10 through 15 were prepared as shown in Table 2.

1. a high frequency power source (50 kHz) produced by Shinko Denki Co., Ltd.
2. a high frequency power source (continuous mode, 100 kHz) produced by Haiden Kenkyusho,
3. a high frequency power source (200 kHz) produced by Pearl Kogyo Co., Ltd.,
4. a high frequency power source (800 kHz) produced by Pearl Kogyo Co., Ltd.,
5. a high frequency power source (13.56 MHz) produced by Nippon Denshi Co., Ltd.,
6. a high frequency power source (27 MHz) produced by Pearl Kogyo Co., Ltd.

(Preparation of Samples)

Employing an atmospheric pressure plasma treatment apparatus as shown in FIG. 11 and the high frequency power source as shown in Table 2, the CHC layer of the long length film substrate prepared above was subjected to plasma discharge treatment for 24 hours while transporting at a transporting speed of 20 m/minute to form a layer on the CHC layer. In the above, the reaction gas Ga was supplied to a discharge space of 1 mm between the ground electrode and the voltage application electrode so that Ga covered the substrate surface, and the inert gas Gn was supplied to the gap so that Gn covered the voltage application electrode surface, each gas being supplied at equal amount (1:1). Thus, samples 10 through 15 were obtained.

Comparative samples 16 through 21 were prepared in the same manner as above, except that the reaction gas Ga only was used.

[Evaluation]

After the 24 hours' continuous plasma discharge treatment, contamination on the voltage application electrode of the apparatus was observed, and evaluated according to the following criteria. Further, strength and thickness distribution of the layer formed were evaluated according to the following criteria.

<Evaluation of Contamination on the Voltage Application Electrode>

A: No contamination was observed.
B: An extremely slight contamination was observed, but no clear contamination was observed.
C: Slight contamination was observed.
D: Apparent contamination was observed.
E: Much contamination was observed.

<Evaluation of Layer Strength>

A 1×1 cm$^2$ probe, to which a steel wool was adhered, was put on the layer of the samples so that the layer faced the steel wool, and a 250 g load was fixed on the surface of the probe opposite the steel wool, and reciprocated 10 times. The number of abrasion lines occurring on the layer was counted, and evaluated according to the following criteria.

A: No abrasion line was observed.
B: One to two abrasion lines were observed.
C: Three to five abrasion lines were observed.
D: Six to twenty abrasion lines were observed.
E: Twenty-one or more abrasion lines were observed.

<Evaluation of Layer Thickness Distribution>

A reflection spectrum of the resulting layer was measured under condition of a 5° regular reflection through a spectrophotometer TYPE 1U-4000 (produced by Hitachi Seisakusho Co., Ltd.). The layer thickness was calculated from the wavelength providing a peak in the reflection spectrum, and the layer thickness distribution was obtained. Measurement was carried out at points at an interval of 2 mm over a length of 10 cm. The layer thickness distribution was evaluated according to the following criteria.

A: 0 to 1%
B: 2 to 7%
C: 8 to 20%
D: 21 to 60%
E: 61 to 100[{]ps

The results are shown in Table 2.

TABLE 2

| Sample No. | Kind of gases on the substrate side | Kind of gases on the second electrode side | High frequency power source Kind of power sources | High frequency power source Hz | Layer strength on the second electrode | Layer strength | Contamination Layer Thickness variation | Remarks |
|---|---|---|---|---|---|---|---|---|
| 10 | Ga | Gn | 1 | 50k | A | C | A | Inv. |
| 11 | Ga | Gn | 2 | 100k | A | B | A | Inv. |
| 12 | Ga | Gn | 3 | 200k | A | A | A | Inv. |
| 13 | Ga | Gn | 4 | 800k | A | A | A | Inv. |
| 14 | Ga | Gn | 5 | 13.56M | A | A | A | Inv. |
| 15 | Ga | Gn | 6 | 27M | A | A | A | Inv. |
| 16 | Ga | | 1 | 50k | B | E | D | Comp. |
| 17 | Ga | | 2 | 100k | C | E | D | Comp. |
| 18 | Ga | | 3 | 200k | E | D | E | Comp. |
| 19 | Ga | | 4 | 800k | E | D | E | Comp. |
| 20 | Ga | | 5 | 13.56M | E | D | E | Comp. |
| 21 | Ga | | 6 | 27M | E | E | E | Comp. |

Inv.: Invention, Comp.: Comparative

Example 6

A sample was prepared employing an atmospheric pressure plasma treatment apparatus as shown in FIG. 4 comprising the planar electrodes. As a base material of the voltage application electrode 2 was used a 20 mm square and 120 mm long stainless steel which had rounded corners of R3 and a penetrated hole for adjusting the temperature. As a base material of the ground electrode 5 was used a stainless steel plate with a size of 100 mm×150 mm×20 mm which had four penetrated holes for adjusting the temperature on the 100 mm×20 mm surface side. These base materials were coated with a dielectric layer in the same manner as in the above examples. Thus, the voltage application electrode 2 and the ground electrode 5 were prepared. A gas was supplied from a gas supply section 50. Gas paths 110 for supplying a gas to the discharge space were prepared as follows. Two losna board plates with a thickness of 2 mm were arranged at an interval of 2 mm to make a discharge space in the slit form. The gap was a path (a reactive gas supply means) for supplying the reactive gas to the discharge space. The voltage application electrodes were arranged at positions 4 mm distant from the boards, and the 4 mm gaps formed between the board and the voltage application electrode was a path (inert gas supply means) for supplying inert gas to the discharge space. A temperature of 80° C. was set through temperature controlling systems provided on the walls of the gas path for supplying a reactive gas to the discharge space.

The following reactive gas (Gas A) and inert gas (gas B) were used.

Gas A: He 99.9% by volume, tetraisopropoxytitanium 0.1% by volume
Gas B: He 99.9% by volume, hydrogen 1.0% by volume The supply speed of the gas A was 0.2 SLM/cm, and the supply speed of the gas B was 0.5 SLM/cm.

A high frequency power source JRF-1000 producd by Nippon Denshi Co., Ltd. was used as a high frequency power source. A discharge output of 10 W/cm$^2$ was supplied with a frequency of 13.56 MHZ. The substrate used comprised a 100 mm×100 mm glass plate with a thickness of 0.5 mm and a 100 mm thick TiO$_2$ layer provided thereon. The transporting speed of the substrate was 0.1 m/second. Thus, ten samples 22 (inventive) were prepared.

Ten samples 23 (comparative) were prepared in the same manner as samples 22 above, except that the gas path formed employing the losna board was not used, and a mixed gas of the gas A and the gas B was supplied through the gas path 110 to the discharge space.

Contamination on the surface of the voltage application electrodes was observed after 10 samples were prepared, and evaluated according to the following criteria:

1: Contaminants were observed on the electrode surface such that the electrode surface need be cleaned.
2: A few contaminants were observed on the electrode surface but the electrode surface need not be cleaned.
3: Few contaminants were observed on the electrode surface.

Further, quality of the layer formed on the substrate was also evaluated. The results are shown in Table 3.

TABLE 3

| Sample No. | Contamination on the surface of the voltage application electrodes | Quality of layer formed on the substrate |
|---|---|---|
| 22 (Inventive) | 3 | All ten samples had a uniform layer |
| 23 (Comparative) | 1 | Sixth sample and thereafter had a layer with streak type unevenness. |

As is apparent from Table 3, the layer forming method employing the atmospheric pressure plasma treatment apparatus of the invention has proved to minimize contaminants on the electrode discharge surface, and to provide improved productivity.

(Results)

The layer forming method of the invention, in which a substrate was subjected to plasma discharge treatment while the inert gas and reactive gas were supplied to the discharge space, separately, so that the inert gas covered the voltage application electrode surface, and so that the reactive gas covered the substrate, caused no contaminants even after 24 hours' continuous operation, and provided a layer with high quality. Further, the method of the invention caused no contaminants even when a high frequency voltage exceeding 100 kHz was applied. In contrast, the comparative method in which the inert gas and reactive gas were not supplied to the discharge space, separately, but only the reactive gas was supplied to the discharge space, caused apparent contaminants, and provided a layer with poor quality.

[Effects of the Invention]

The present invention can provide an atmospheric pressure plasma treatment apparatus and an atmospheric pressure plasma treatment method which maintain durability of the electrode over a long term, realize stable discharge, minimize contamination on the electrode surface, and can stably form a layer over a long time.

What is claimed is:

1. An atmospheric pressure plasma treatment method comprising the steps of:

supplying a reactive gas and an inert gas to a discharge space formed between a first electrode and a second electrode opposed to each other;

applying voltage across the discharge space;

exciting the reactive gas at atmospheric pressure or at approximately atmospheric pressure to generate discharge plasma; and subjecting a substrate to surface treatment by exposing the substrate to the discharge plasma;

subjecting a substrate to surface treatment by exposing the substrate to the discharge plasma;

wherein the reactive gas is not directly in contact with the discharge surface of the first electrode or the second electrode.

2. The atmospheric pressure plasma treatment method of claim 1, wherein the reactive gas and the inert gas are supplied to the discharge space, separately.

3. The atmospheric pressure plasma treatment method of claim 2, wherein the substrate is provided so as to cover a discharge surface of the second electrode, the reactive gas is supplied to the side of the second electrode and the inert gas is supplied to the side of the first electrode.

4. The atmospheric pressure plasma treatment method of claim 2, wherein the substrate is provided so as to cover the surface of the second electrode, the first electrode is comprised of plural electrodes arranged at an interval, and the inert gas and the reactive gas are supplied from at least one of the intervals between the two adjacent electrodes of the plural electrodes to the surface of the substrate provided on the second electrode.

5. The atmospheric pressure plasma treatment method of claim 1, wherein the temperature of the reactive gas is controlled.

6. The atmospheric pressure plasma treatment method of claim 5, wherein the reactive gas is controlled to be a temperature higher than temperature at which the reactive gas gives a saturated vapor pressure at its concentration.

7. The atmospheric pressure plasma treatment method of claim 1, wherein the first electrode or the second electrode is a dielectric coated electrode in which a metal base material is coated with a dielectric layer.

8. The atmospheric pressure plasma treatment method of claim 7, wherein the dielectric layer is a layer formed by thermally spraying ceramic on a base material to form a ceramic layer, and then sealing the ceramic layer.

9. The atmospheric pressure plasma treatment method of claim 1, wherein the first electrode or the second electrode is cooled.

10. The atmospheric pressure plasma treatment method of claim 1, wherein the first electrode and the second electrode both have planar surfaces, and the surfaces of the first electrode and the second electrode are provided so as to insert the same plane and so as to be in parallel with each other.

11. The atmospheric pressure plasma treatment method of claim 1, wherein at least one of the first and second electrodes is a rotatory roll electrode.

12. The atmospheric pressure plasma treatment method of claim 11, wherein the second electrode is a rotatory roll electrode, and the first electrode is comprised of plural electrodes, the surface of the plural electrodes being substantially in parallel with the surface of the second electrode.

13. The atmospheric pressure plasma treatment method of claim 11, wherein the second electrode is a rotatory roll electrode, and the first electrode has a concave surface which is substantially in parallel with the curved surface of the second electrode.

14. The atmospheric pressure plasma treatment method of claim 1, wherein the voltage applied is a high frequency voltage with a frequency exceeding 100 kHz.

15. The atmospheric pressure plasma treatment method of claim 14, wherein the output of the high frequency voltage is not less than 1 W/cm$^2$.

16. The atmospheric pressure plasma treatment method of claim 1, wherein the reactive gas comprises a component selected from an organometallic compound and an organic compound.

17. The atmospheric pressure plasma treatment method of claim 16, wherein the organometallic compound is selected from the group consisting of a metal alkoxide, an alkylated metal and a metal complex.

18. The atmospheric pressure plasma treatment method of claim 17, wherein the reactive gas comprises a component selected from helium, neon, argon, krypton, xenon, radon and nitrogen.

19. The atmospheric pressure plasma treatment method of claim 17, wherein the reactive gas comprises a component selected from oxygen, ozone, hydrogen peroxide, carbon dioxide, carbon monoxide, hydrogen, water vapor, nitrogen oxides and ammonia.

20. The atmospheric pressure plasma treatment method of claim 1, wherein the inert gas comprises a component selected from helium, neon, argon, krypton, xenon, radon, and nitrogen.

21. The atmospheric pressure plasma treatment method of claim 20, wherein the inert gas comprises a component selected from oxygen, ozone, hydrogen peroxide, carbon dioxide, carbon monoxide, hydrogen, nitrogen, water vapor, nitrogen oxides and ammonia.

22. The atmospheric pressure plasma treatment method of claim 1, wherein the first electrode is a voltage application electrode and the second electrode is a ground electrode.

23. The atmospheric pressure plasma treatment method of claim 1, wherein a layer is formed on the substrate by the surface treatment.

* * * * *